US012707648B2

(12) United States Patent
Yin et al.

(10) Patent No.: US 12,707,648 B2
(45) Date of Patent: Aug. 11, 2026

(54) BIT-LINE RESISTANCE REDUCTION

(71) Applicant: Taiwan Semiconductor Manufacturing Company, Ltd., Hsinchu (TW)

(72) Inventors: Yu-Feng Yin, Hsinchu County (TW); Min-Kun Dai, Hsinchu City (TW); Chien-Hua Huang, Toufen Township (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 913 days.

(21) Appl. No.: 17/690,728

(22) Filed: Mar. 9, 2022

(65) Prior Publication Data

US 2023/0157032 A1 May 18, 2023

Related U.S. Application Data

(60) Provisional application No. 63/279,714, filed on Nov. 16, 2021.

(51) Int. Cl.
*H10B 61/00* (2023.01)
*G11C 5/06* (2006.01)
(Continued)

(52) U.S. Cl.
CPC ............. *H10B 61/22* (2023.02); *G11C 5/063* (2013.01); *G11C 7/18* (2013.01); *G11C 11/161* (2013.01);
(Continued)

(58) Field of Classification Search
CPC ........ H10B 61/22; H10N 50/01; H10N 50/80; G11C 5/063; G11C 7/18; G11C 11/161; G11C 11/1655
See application file for complete search history.

(56) References Cited

U.S. PATENT DOCUMENTS

2005/0127428 A1 6/2005 Mokhlesi et al.
2013/0235656 A1* 9/2013 Li .......................... G11C 11/15 257/421
(Continued)

FOREIGN PATENT DOCUMENTS

TW 200541081 A 12/2005

OTHER PUBLICATIONS

U.S. Appl. No. 17/465,351, filed Sep. 2, 2021.
U.S. Appl. No. 17/463,985, filed Sep. 1, 2021.

*Primary Examiner* — Yara B Green
*Assistant Examiner* — Christopher M Roland
(74) *Attorney, Agent, or Firm* — Eschweiler & Potashnik, LLC

(57) ABSTRACT

The present disclosure relates integrated chip structure. The integrated chip structure includes a memory array having a plurality of memory devices arranged in a plurality of rows and a plurality of columns. A word-line is coupled to a first set of the plurality of memory devices disposed within a first row of the plurality of rows. A bit-line is coupled to a second set of the plurality of memory devices disposed within a first column of the plurality of columns. A local interconnect extends in parallel to the bit-line and is coupled to the bit-line and two or more of the second set of the plurality of memory devices. The local interconnect is coupled to the bit-line by a plurality of interconnect vias that are between the local interconnect and the bit-line.

20 Claims, 23 Drawing Sheets

(51) Int. Cl.

| | |
|---|---|
| ***G11C 7/18*** | (2006.01) |
| ***G11C 11/16*** | (2006.01) |
| ***H10N 50/01*** | (2023.01) |
| ***H10N 50/80*** | (2023.01) |

(52) U.S. Cl.
CPC ......... *G11C 11/1655* (2013.01); *H10N 50/01* (2023.02); *H10N 50/80* (2023.02)

(56) References Cited

U.S. PATENT DOCUMENTS

| | | | | |
|---|---|---|---|---|
| 2016/0141496 | A1* | 5/2016 | Park | H10B 61/10<br>438/3 |
| 2017/0092693 | A1* | 3/2017 | Tan | H10N 50/01 |
| 2018/0350876 | A1* | 12/2018 | Lee | H10N 50/80 |
| 2020/0105772 | A1* | 4/2020 | Chen | H10B 53/30 |
| 2021/0376228 | A1 | 12/2021 | Peng et al. | |
| 2021/0376231 | A1 | 12/2021 | Yin et al. | |
| 2021/0391532 | A1 | 12/2021 | Yin et al. | |
| 2022/0069201 | A1 | 3/2022 | Yin et al. | |
| 2022/0115583 | A1* | 4/2022 | Wang | H10N 50/80 |
| 2022/0310697 | A1* | 9/2022 | Wang | H10B 61/00 |
| 2023/0123764 | A1* | 4/2023 | Xu | H10B 61/00<br>257/422 |
| 2025/0344404 | A1* | 11/2025 | Yin | G11C 11/1655 |

* cited by examiner

2100

2102

140

$126U_1$

136

124

136

BIT-LINE RESISTANCE REDUCTION

REFERENCE TO RELATED APPLICATION

This application claims the benefit of U.S. Provisional Application No. 63/279,714, filed on Nov. 16, 2021, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Magneto-resistive random-access memory (MRAM) is one promising candidate for a next generation non-volatile memory technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
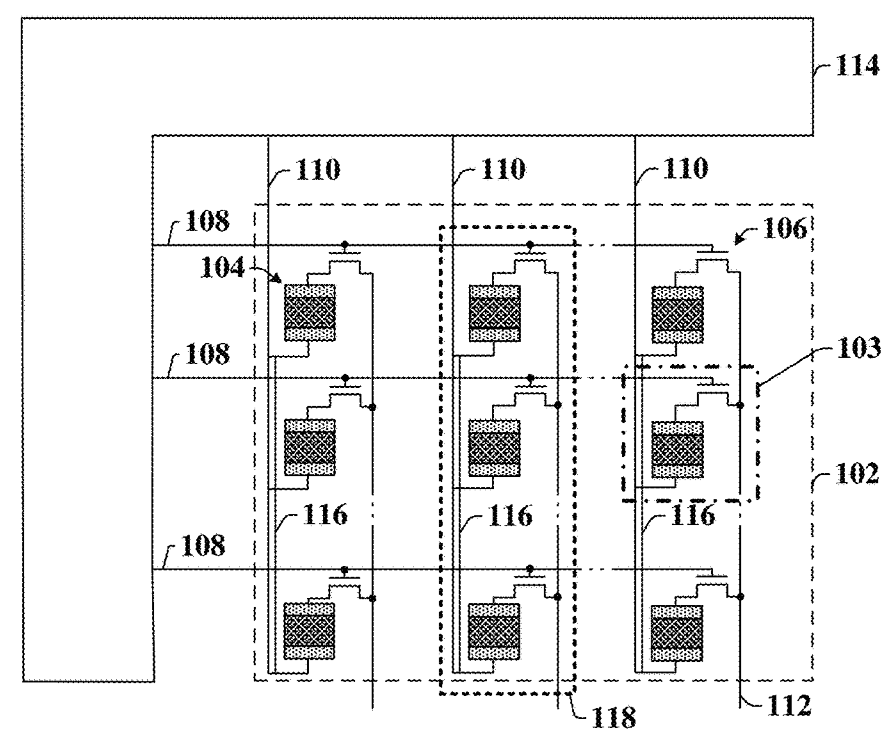
FIGS. 1A-1B illustrate some embodiments of an integrated chip structure comprising a memory array having a local interconnect configured to reduce a resistance of a bit-line.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) cells comprise a magnetic tunnel junction (MTJ) arranged between conductive electrodes. The MTJ comprises a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned layer. The parallel configuration provides for a low resistance state that digitally stores data as a first bit value (e.g., a logical "1"). The anti-parallel configuration provides for a high resistance state that digitally stores data as a second bit value (e.g., a logical "0").

MRAM devices may be arranged on an integrated chip structure in an array comprising rows and columns. MRAM devices within a row are operably coupled to a word-line that is further coupled to a word-line decoder. MRAM devices within a column are operably coupled to bit-lines that are further coupled to a bit-line decoder. During operation, the word-line decoder and the bit-line decoder are configured to selectively apply signals to the word-lines and bit-lines. By selectively applying signals to the word-lines and bit-lines, data can be written to and/or read from different ones of the MRAM devices within an array.

As a functionality of integrated chips has increased, the need for more memory has also increased, causing integrated chip designers and manufacturers to increase the amount of available memory. To reach this goal, a size of memory arrays may be increased, thereby increasing a length of word-lines and/or bit-lines within an array. Furthermore, a size of memory array components may also be decreased, thereby decreasing a size (e.g., a width and/or height) of the word-lines and bit-lines. However, increasing a length of the word-lines and bit-lines and/or reducing a size of the word-lines and bit-lines causes a resistance of the word-lines and bit-lines to increase (since R=ρ*L/A, where R is resistance, ρ is resistivity, L is a length, and A is a cross-sectional area). Increasing the resistance of the word-lines and/or bit-lines can decrease performance of a memory array. For example, increasing a resistance of a bit-line may increase a variation in read signals received from different parts of an array and/or driving signals provided to different parts of the array. The increased variations may reduce a memory window (e.g., a difference between signals output from an MRAM device in a low resistance state and a high resistance state) of a memory array and ultimately lead to errors in reading and/or writing data.

The present disclosure relates to an integrated chip structure comprising a memory array having a local interconnect that is configured to reduce a resistance of a bit-line within the memory array. In some embodiments, the integrated chip structure may comprise a memory array having a plurality of memory devices. The plurality of memory devices are arranged in a plurality of rows and a plurality of columns. A word-line is operably coupled to a first set of the plurality of memory devices disposed within a first row of the plurality of rows. A bit-line is operably coupled to a second set of the plurality of memory devices disposed within a first column of the plurality of columns. A local interconnect extends in parallel to the bit-line and is coupled between the bit-line and two or more of the second set of the plurality of memory devices. Because the local interconnect is coupled to and extends in parallel to the bit-line, the local interconnect is able to reduce a resistance of first bit-line. By reducing a resistance of the bit-line, the local interconnect is able to improve a performance of the integrated chip structure.

FIG. 1A illustrates a schematic diagram 100 of some embodiments of an integrated chip structure comprising a memory array having a local interconnect configured to reduce a resistance of a bit-line.

As shown in the schematic diagram 100, the integrated chip structure comprises a memory array 102 including a plurality of memory cells 103 arranged within rows and/or columns. The plurality of memory cells 103 comprise memory devices 104 and access devices 106 configured to control access to the memory devices 104. A first set of the plurality of memory devices 104 within a row respectively have access devices 106 that are operably coupled to a word-line 108. A second set of the plurality of memory devices 104 within a column are operably coupled to a bit-line 110. In some embodiments, the second set of the plurality of memory devices 104 within the column may have access devices 106 that are further coupled to a source-line 112. The word-line 108 and the bit-line 110 are coupled to control circuitry 114, which is configured to selectively apply signals to the word-line 108 and/or the bit-line 110 to access (e.g., write data to and/or read data from) one or more of the plurality of memory devices 104.

A local interconnect 116 extends in parallel to the bit-line 110. The local interconnect 116 is coupled between the bit-line 110 and two or more of the second set of the plurality of memory devices 104 within the column of the memory array 102. Because the local interconnect 116 is coupled to and extends in parallel to the bit-line 110, the local interconnect 116 is able to provide an alternative path for signals that are applied to the bit-line 110 by way of the control circuitry 114. By providing an alternative path for signals that are applied to the bit-line 110, the local interconnect 116 is able to reduce a resistance of the bit-line 110. By reducing a resistance of the bit-line 110, the local interconnect 116 is able to improve a performance (e.g., a memory window) of the memory array 102.

Figure 1B:
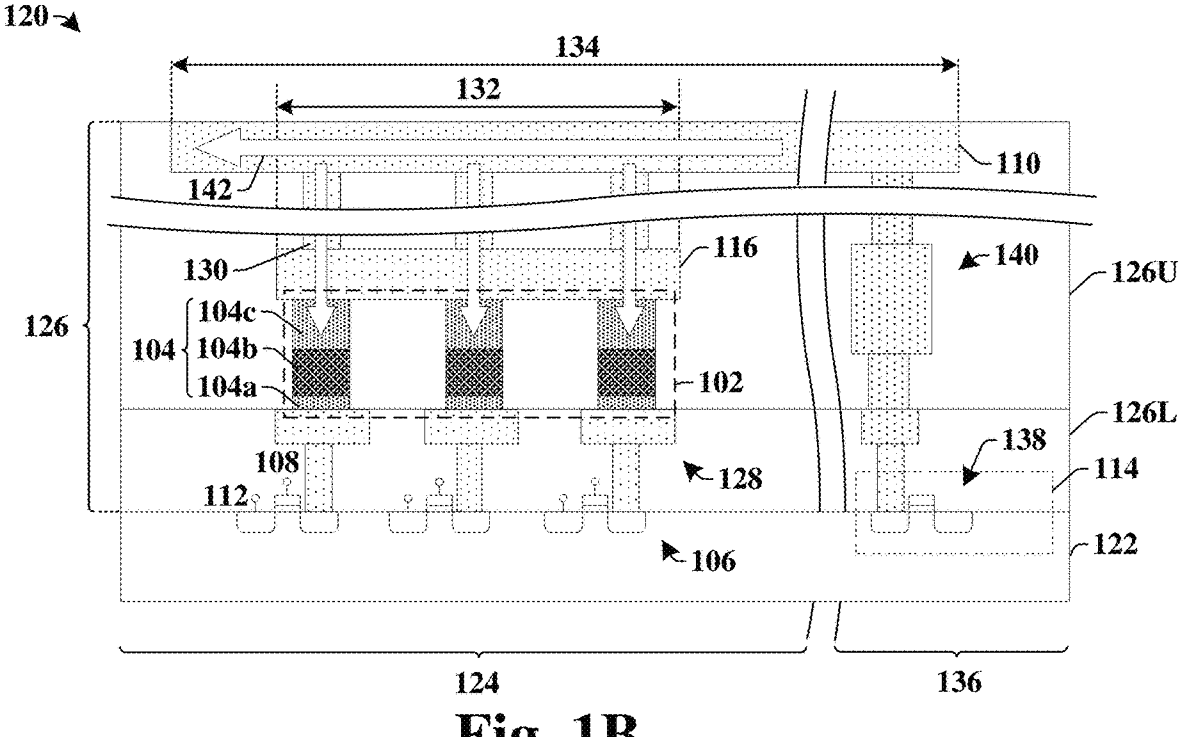

FIG. 1B illustrates a cross-sectional view 120 of some embodiments of an integrated chip structure corresponding to section 118 of the schematic diagram 100 shown in FIG. 1A.

As shown in cross-sectional view 120, the integrated chip structure comprises an embedded memory region 124 and a peripheral region 136 (e.g. a logical region comprising one or more transistor devices configured to perform logical functions). A memory array 102 is disposed within the embedded memory region 124. The memory array 102 comprises a plurality of memory devices 104 disposed within a dielectric structure 126 over a substrate 122. The plurality of memory devices 104 respectively comprise a data storage structure **104*b* disposed been a bottom electrode 104*a* and a top electrode 104*c*. In some embodiments, the dielectric structure 126 comprises a lower inter-level dielectric (ILD) structure 126L and an upper ILD structure 126U over the lower ILD structure 126**L.

In some embodiments, a plurality of access devices 106 are disposed within the embedded memory region 124. In some embodiments, the plurality of access devices 106 are coupled to the plurality of memory devices 104 by way of a plurality of lower interconnects 128 within the lower ILD structure 126L. In some additional embodiments, one or more transistor devices 138 are disposed within the peripheral region 136. The one or more transistor devices 138 may be part of a control circuitry 114 configured to selectively apply signals to the one or more memory devices 104.

A local interconnect 116 is arranged within the upper ILD structure 126U and extends in parallel to the bit-line 110. The local interconnect 116 is coupled to the plurality of memory devices 104. The local interconnect 116 is further coupled to an overlying bit-line 110 by way of a plurality of interconnect vias 130 that are directly between the local interconnect 116 and the bit-line 110. In some embodiments, the local interconnect 116 has a first length 132 (e.g., measured along a longest dimension of the local interconnect 116) and the bit-line 110 has a second length 134 (e.g., measured along a longest dimension of the bit-line 110) that is greater than the first length 132. In some embodiments, the bit-line 110 extends past one end of the local interconnect 116. In some additional embodiments, the bit-line 110 extends past opposing ends of the local interconnect 116.

The bit-line 110 extends from within the embedded memory region 124 to within the peripheral region 136. The bit-line 110 is coupled to the control circuitry 114, by way of one or more peripheral interconnects 140. In some embodiments, the one or more peripheral interconnects 140 may comprise an interconnect via and/or an interconnect wire. In some alternative embodiments (not shown), the bit-line 110 may be coupled to a voltage source that is disposed within the dielectric structure 126 over the bit-line 110. In some embodiments, the bit-line 110 extends to within the peripheral region 136 of the substrate 122 and the local interconnect 116 is confined within the embedded memory region 124 of the substrate 122. Confining the local interconnect 116 within the embedded memory region 124 provides space within the peripheral region 136 for other interconnect routing.

During operation, the control circuitry 114 is configured to perform an access operation (e.g., a read operation or a write operation) on one of the plurality of memory devices 104 by selectively applying a signal 142 (e.g., a read current, a driving current, or the like) to the bit-line 110. Typically, a resistance of the bit-line 110 will be proportional to the second length 134 of the bit-line 110 divided by a cross-sectional area of the bit-line 110 (since R=ρ*L/A). However, because the local interconnect 116 is coupled to the bit-line 110 by way of the plurality of interconnect vias 130, the signal 132 has multiple parallel paths between the control circuitry 114 and the plurality of memory devices 104. The multiple parallel paths provide for a larger cumulative cross-sectional area for a signal 142 to travel through, thereby reducing a resistance of the bit-line 110. By reducing a resistance of the bit-line 110, a performance (e.g., a memory window) of the integrated chip structure can be improved.

Figure 2:
FIG. 2 illustrates a cross-sectional view of some embodiments of an integrated chip structure comprising a memory array having a local interconnect configured to reduce a resistance of a bit-line.
Figure 2:
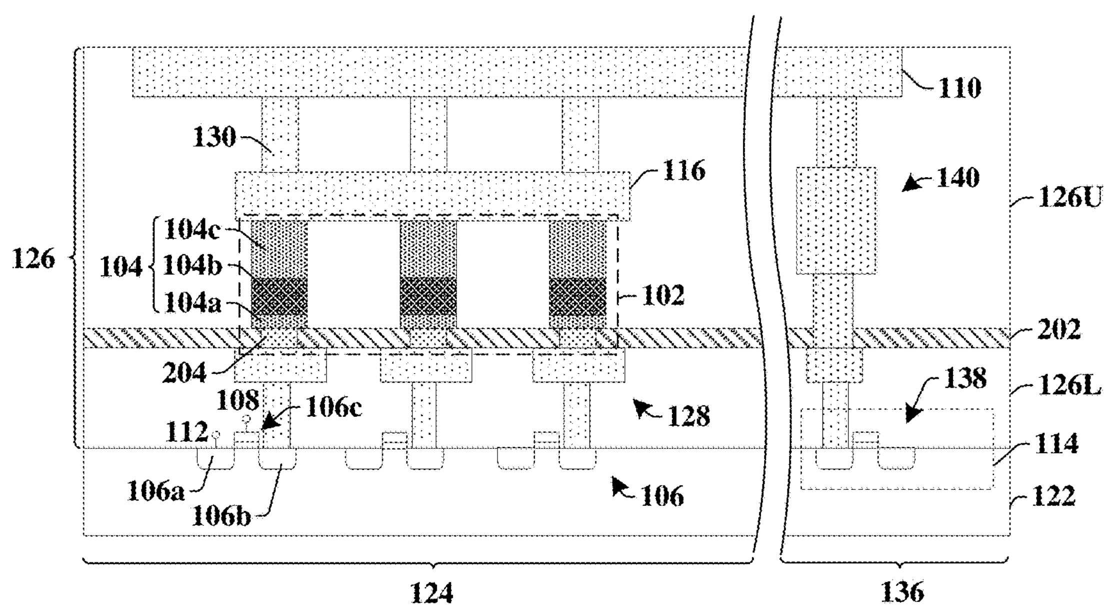

FIG. 2 illustrates a cross-sectional view of some additional embodiments of an integrated chip structure 200 comprising a memory array having a local interconnect configured to reduce a resistance of a bit-line.

The integrated chip structure 200 comprises an embedded memory region 124 and a peripheral region 136. A memory array 102 is disposed within the embedded memory region 124. The memory array 102 comprises a plurality of memory devices 104 disposed within a dielectric structure 126 over a substrate 122. The plurality of memory devices 104 respectively comprise a data storage structure 104*b* disposed between a bottom electrode 104*a* and a top electrode 104*c*. In some embodiments, the bottom electrode 104*a* and the top electrode 104*c* may comprise a metal, such as tantalum, titanium, tantalum nitride, titanium nitride, platinum, nickel, hafnium, zirconium, ruthenium, iridium, or the like.

In some embodiments, the dielectric structure 126 comprises a lower ILD structure 126L and an upper ILD structure 126U. The lower ILD structure laterally surrounds a plurality of lower interconnects 128. In some embodiments, the plurality of lower interconnects 128 may comprise conductive contacts, interconnect wires, and/or interconnect vias including one or more of copper, aluminum, tungsten, ruthenium, or the like. The upper ILD structure 126U laterally surrounds the plurality of memory devices 104. In some embodiments, the lower ILD structure 126L and/or the upper ILD structure 126U may comprise one or more of silicon dioxide, carbon doped silicon oxide (SiCOH), phosphosilicate glass (PSG), borophosphosilicate glass (BPSG), borosilicate glass (BSG), fluorosilicate glass (FSG), undoped silicate glass (USG), or the like.

In some embodiments, a plurality of access devices 106 are disposed within the embedded memory region 124 and are coupled to the plurality of memory devices 104 by way of the plurality of lower interconnects 128. In some embodiments, the plurality of access devices 106 may respectively comprise a MOSFET device having a gate structure 106*c* that is laterally arranged between a source region 106*a* and a drain region 106*b*. In some embodiments, the gate structure 106*c* may comprise a gate electrode that is separated from the substrate 122 by a gate dielectric. In some embodiments, the source region 106*a* is coupled to a source-line 112 and the gate structure 106*c* is coupled to a word-line 108. In various embodiments, the MOSFET device may comprise a planar FET, a FinFET, a gate-all-around (GAA) device, or the like. In other embodiments, the access device 106 may comprise a HEMT (high-electron-mobility transistor), a BJT (bipolar junction transistor), a JFET (junction-gate field-effect transistor), or the like.

In some embodiments, the lower ILD structure 126L is separated from the upper ILD structure 126U by way of a lower insulating structure 202. A bottom electrode via 204 extends through the lower insulating structure 202 to couple the plurality of memory devices 104 to the plurality of lower interconnects 128. In some embodiments, the lower insulating structure 202 may comprise one or more dielectric layers stacked onto one another. In various embodiments, the one or more dielectric layers may comprise one or more of silicon rich oxide, silicon carbide, silicon dioxide, silicon nitride, or the like.

A local interconnect 116 is arranged within the upper ILD structure 126U and is coupled to the plurality of memory devices 104. The local interconnect 116 is further coupled to an overlying bit-line 110 by way of a plurality of interconnect vias 130. The local interconnect 116 extends in parallel to the bit-line 110 and is coupled between the bit-line 110 and the plurality of memory devices 104. In some embodiments, the local interconnect 116 continuously extends laterally past the plurality of memory devices 104 and the plurality of interconnect vias 130. In some embodiments, the bit-line 110 comprises a bottom surface that continuously extends laterally past both the plurality of interconnect vias 130 and the local interconnect 116. In some embodiments, the plurality of interconnect vias 130 are arranged in an array that laterally extends past two or more of the plurality of memory devices 104, so that the plurality of interconnect vias 130 laterally extend past the two or more of the plurality of memory devices 104. In some embodiments (not shown), the memory array 102 comprises one or more additional memory devices that are laterally outside of the local interconnect 116 and directly below the bit-line 110. In such embodiments, the memory array 102 extends laterally past one or more outer edges of the local interconnect 116.

In some embodiments, the plurality of interconnect vias 130 have bottom surfaces that physically contact the local interconnect 116 and top surfaces that physically contact the bit-line 110. In some such embodiments, the local interconnect 116 and the bit-line 110 may be disposed on neighboring interconnect wire layers of a back-end-of-the-line (BEOL) stack. For example, the local interconnect 116 may be disposed on a sixth interconnect wire layer (e.g., an interconnect wire layer that is a sixth interconnect wire layer above the substrate 122), while the bit-line 110 may be disposed on a seventh interconnect wire layer (e.g., an interconnect wire layer that is a seven interconnect wire layer above the substrate 122).

Figure 3:
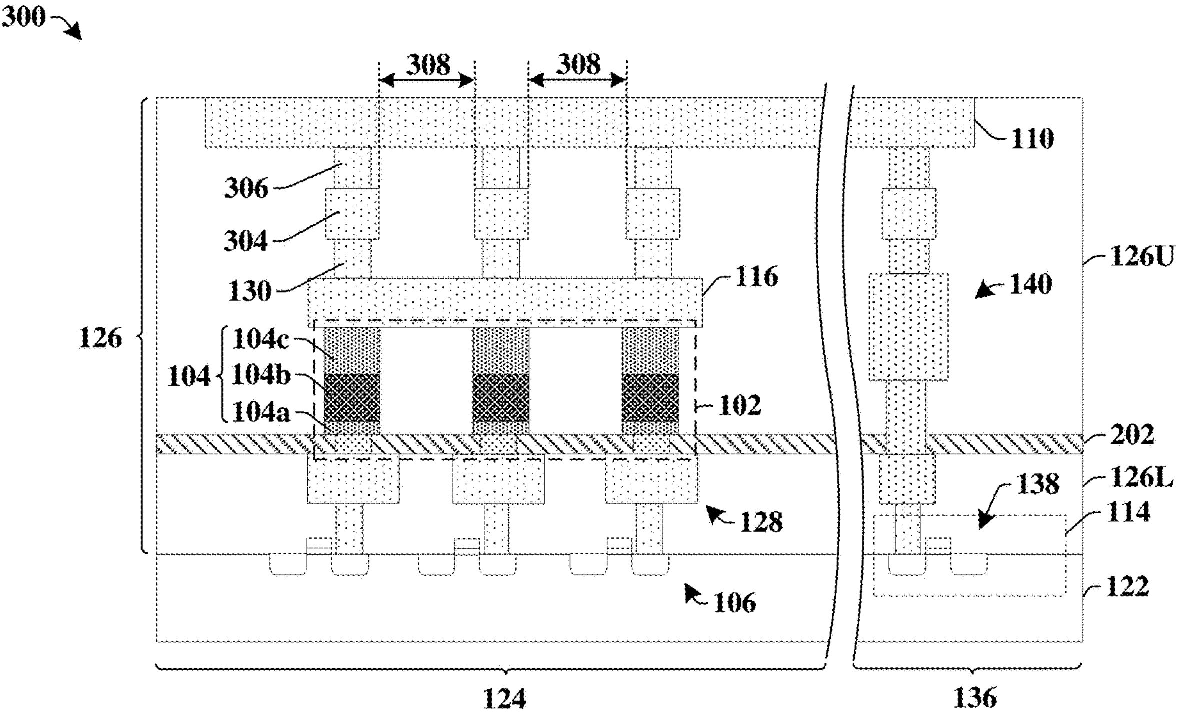
FIG. 3 illustrates a cross-sectional view of some additional embodiments of an integrated chip structure comprising a memory array having a local interconnect configured to reduce a resistance of a bit-line.

FIG. 3 illustrates a cross-sectional view of some additional embodiments of an integrated chip structure 300 comprising a memory array having a local interconnect configured to reduce a resistance of a bit-line.

The integrated chip structure 300 comprises an embedded memory region 124 and a peripheral region 136. A memory array 102 is disposed within the embedded memory region 124. The memory array 102 comprises a plurality of memory devices 104 disposed within a dielectric structure 126 over a substrate 122. A local interconnect 116 is arranged within the dielectric structure 126 directly over the plurality of memory devices 104. The local interconnect 116 is coupled to the plurality of memory devices 104. The local interconnect 116 is further coupled to an overlying bit-line 110 by way of a plurality of interconnect vias 130, a plurality of interconnect islands 304, and a plurality of additional upper interconnect vias 306.

The plurality of interconnect vias 130 have bottom surfaces that physically contact the local interconnect 116 and top surfaces that physically contact the plurality of interconnect islands 304. The plurality of additional upper interconnect vias 306 have bottom surfaces that physically contact the plurality of interconnect islands 304 and top surfaces that physically contact the bit-line 110. The plurality of interconnect islands 304 have bottom surfaces that laterally extend past one or more outer edges of the plurality of interconnect vias 130, and top surfaces that laterally extend past one or more outer edges of the plurality of additional upper interconnect vias 306. In some embodiments, the plurality of interconnect islands 304 have outer edges that are directly over a top surface of the local interconnect 116 and that are separated from one another by one or more non-zero distances 308 that are over the top surface of the local interconnect 116.

By having the plurality of interconnect islands 304 disposed between the local interconnect 116 and the bit-line 110, a distance between the local interconnect 116 and the bit-line 110 is increased thereby reducing a capacitance on the bit-line 110 and improving a performance of the integrated chip structure 300. Furthermore, the plurality of interconnect islands 304 allow for the bit-line 110 to be formed on a relatively large interconnect wire layer (e.g., comprising a greater height and/or width than the bit-line 110 shown in FIG. 2). Forming the bit-line 110 on a relatively large interconnect wire layer will give the bit-line 110 a relatively low resistance that will further improve the performance of the integrated chip structure 300.

Figure 4:
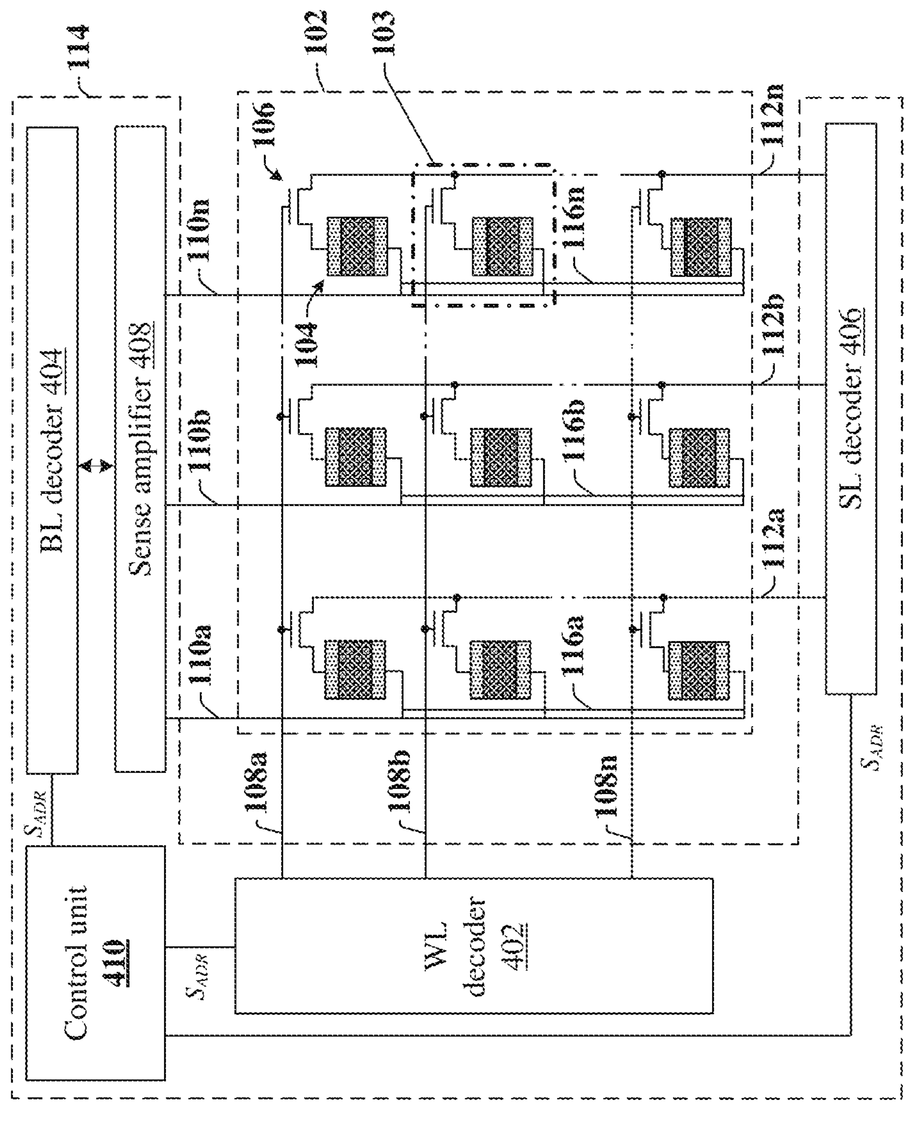
FIG. 4 illustrates a schematic diagram of some additional embodiments of an integrated chip structure comprising a memory array having a local interconnect configured to reduce a resistance of a bit-line.

FIG. 4 illustrates a schematic diagram 400 of some additional embodiments of an integrated chip structure comprising a memory array having a local interconnect configured to reduce a resistance of a bit-line.

As shown in the schematic diagram 400, the integrated chip structure comprises a memory array 102 including a plurality of memory cells 103 arranged within rows and/or columns. The plurality of memory cells 103 comprise a plurality of memory devices 104 and a plurality of access devices 106 configured to control access to the plurality of memory devices 104. A first set of the plurality of memory devices 104 within a row respectively have access devices 106 that are operably coupled to one of a plurality of word-lines **108*a*-108*n*. A second set of the plurality of memory devices 104 within a column are operably coupled to one of a plurality of bit-lines 110*a*-110*n*. In some embodiments, the plurality of memory devices 104 within the column comprise access devices 106 that are further coupled to one of a plurality of source-lines 112*a*-112*n***.

A plurality of local interconnects **116*a*-116*n* extends in parallel to the plurality of bit-lines 110*a*-110*n*. The plurality of local interconnects 116*a*-116*n* are coupled between one of the plurality of bit-lines 110*a*-110*n* and two or more of plurality of memory devices 104 within the column of the memory array 102. The plurality of word-lines 108*a*-108*n*, the plurality of bit-lines 110*a*-110*n*, and/or the plurality of source-lines 112*a*-112*n* are further coupled to control circuitry 114. In some embodiments, the control circuitry 114 comprises a word-line decoder 402 coupled to the plurality of word-lines 108*a*-108*n*, a bit-line decoder 404 coupled to the plurality of bit-lines 110*a*-110*n*, and/or a source-line decoder 406 coupled to the plurality of source-lines 112*a*-112*n*. In some embodiments, the control circuitry 114 further comprises a control unit 410 coupled to the word-line decoder 402, the bit-line decoder 404, and/or the source-line decoder 406**.

During operation, the control circuitry 114 is configured to provide address information $S_{ADR}$ to the word-line decoder 402, the bit-line decoder 404, and/or the source-line decoder 406. Based on the address information $S_{ADR}$, the word-line decoder 402 is configured to selectively apply a bias voltage to one of the plurality of word-lines **108*a*-108*n*. Concurrently, the bit-line decoder 404 is configured to selectively apply a bias voltage to one of the plurality of bit-lines 110*a*-110*n* and/or the source-line decoder 406 is configured to selectively apply a bias voltage to one of the plurality of source-lines 112*a*-112*n*. By applying bias voltages to selective ones of the plurality of word-lines 108*a*-108*n*, the plurality of bit-lines 110*a*-110*n*, and/or the plurality of source-lines 112*a*-112*n*, the control circuitry 114 can be operated to write different data states to and/or read data states from the plurality of memory cells 103**.

In some embodiments, the control circuitry 114 further comprises a sense amplifier 408 coupled to the plurality of bit-lines **110*a*-110*n*. During a read operation, the plurality of bit-lines 110*a*-110*n* are configured to provide a read signal (e.g., a read current and/or voltage) to the sense amplifier 408. The sense amplifier 408 is configured to compare the read signal to a reference signal to determine a data state within an accessed memory device. Because the plurality of local interconnects 116*a*-116*n* are coupled in parallel to the plurality of bit-lines 110*a*-110*n*, the plurality of bit-lines 110*a*-110*n*** will have a lower resistance that mitigates degradation of the read signal.

Figure 5:
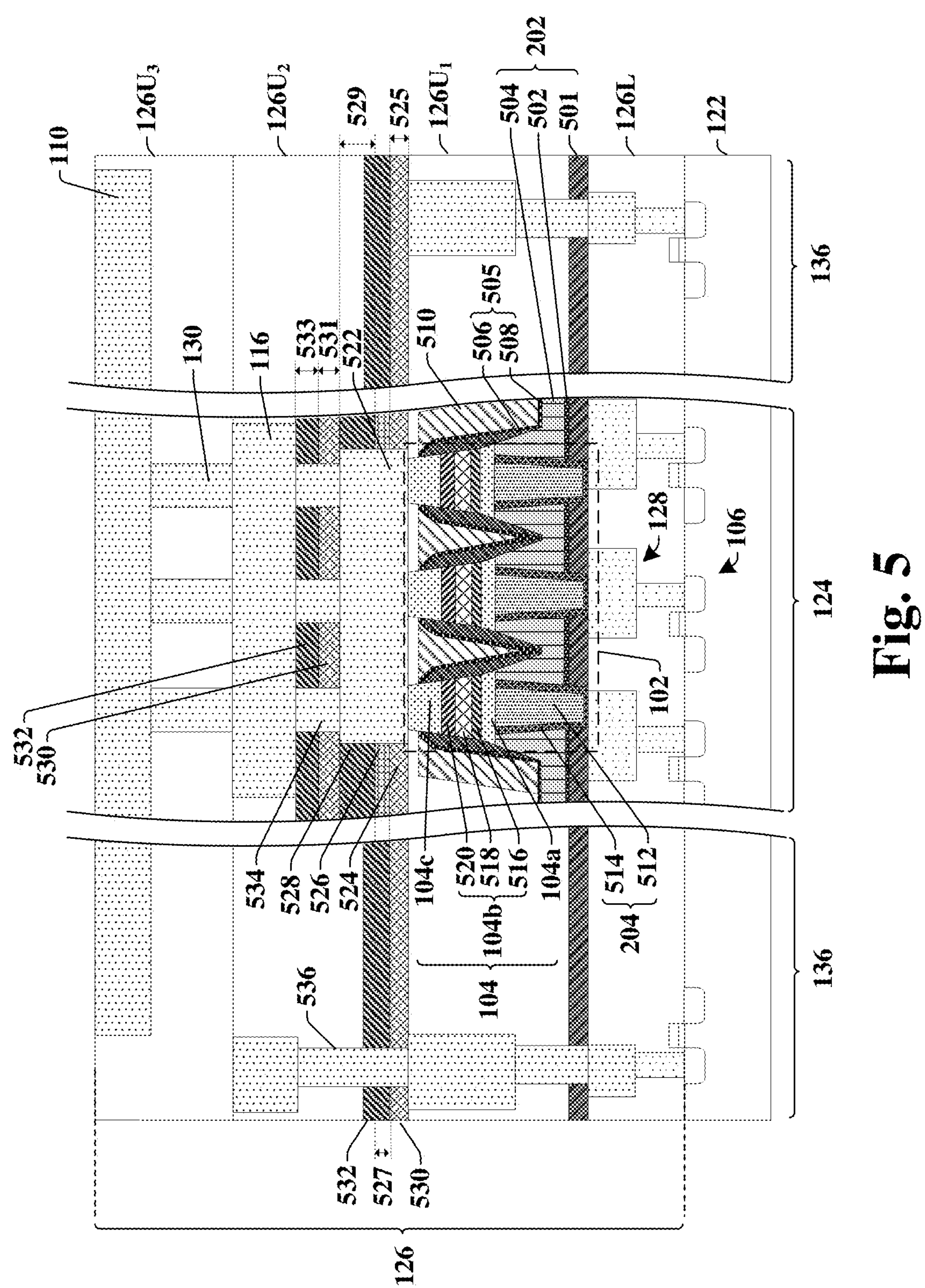
FIG. 5 illustrates a cross-sectional view of some additional embodiments of an integrated chip structure comprising a memory array having a local interconnect configured to reduce a resistance of a bit-line.

FIG. 5 illustrates a cross-sectional view of some additional embodiments of an integrated chip structure 500 comprising a memory array having a local interconnect configured to reduce a resistance of a bit-line.

The integrated chip structure 500 comprises an embedded memory region 124 and a peripheral region 136. A memory array 102 is disposed within the embedded memory region 124. The memory array 102 comprises a plurality of memory devices 104 disposed within a dielectric structure 126 over a substrate 122. In some embodiments, the dielectric structure 126 comprises a lower ILD structure 126L separated from an upper ILD structure 126U by a lower insulating structure 202. The lower ILD structure 126L surrounds a plurality of lower interconnects 128. In some embodiments, the plurality of memory devices 104 may be disposed over the lower insulating structure 202 and be surrounded by the upper ILD structure 126U. In some embodiments, the upper ILD structure 126U may comprise a plurality of upper ILD layers 126$U_1$-126$U_3$ stacked onto one another.

In some embodiments, the lower insulating structure 202 comprises a first lower insulating layer 501 arranged within the embedded memory region 124 and the peripheral region 136. The lower insulating structure 202 may further comprise a second lower insulating layer 502 disposed over the first lower insulating layer 501 and a third lower insulating layer 504 disposed over the second lower insulating layer 502. In some embodiments, the second lower insulating layer 502 and the third lower insulating layer 504 are confined within the embedded memory region 124.

A bottom electrode via 204 extends through the lower insulating structure 202 between the plurality of lower interconnects 128 and the plurality of memory devices 104. In some embodiments, the bottom electrode via 204 may comprise a diffusion barrier layer 514 and a conductive core 512 surrounded by the diffusion barrier layer 514. In some embodiments, the diffusion barrier layer 514 may comprise one or more of titanium, titanium nitride, tantalum, tantalum nitride, or the like. In some embodiments, the conductive core 512 may comprise one or more of aluminum, copper, tungsten, titanium, titanium nitride, tantalum, tantalum nitride, or the like.

In some embodiments, the plurality of memory devices 104 respectively comprise a data storage structure **104*b* disposed been a bottom electrode 104*a*** and a top electrode 104*c*. In some embodiments, the data storage structure 104*b* may comprise a magnetic tunnel junction (MTJ). In such embodiments, the data storage structure 104*b* may comprise a pinned layer 516 separated from a free layer 520 by a dielectric tunnel barrier 518. The pinned layer 516 has a magnetization that is fixed, while the free layer 520 has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 516. A relationship between the magnetizations of the pinned layer 516 and the free layer 520 define a resistive state of the MTJ and thereby enables the MTJ to store a data state.

Sidewall spacers 505 may be disposed along sidewalls of the lower insulating structure 202 and the plurality of memory devices 104. In some embodiments, the sidewall spacers 505 may comprise a first sidewall spacer layer 506 and a second sidewall spacer layer 508 over the first sidewall spacer layer 506. In some embodiments, the top electrode 104*c* protrudes outward from a top of the sidewall spacers 505. In some embodiments, the first sidewall spacer layer 506 and/or the second sidewall spacer layer 508 may comprise an oxide (e.g., silicon rich oxide), a nitride (e.g., silicon nitride), a carbide (e.g., silicon carbide), or the like. A dielectric encapsulation structure 510 is disposed on the sidewall spacers 505 and a first upper ILD layer 126$U_1$ is arranged on and around the dielectric encapsulation structure 510.

An upper-level etch stop dielectric layer 524 is arranged over the first upper ILD layer 126$U_1$. In various embodiments, the upper-level etch stop dielectric layer 524 comprises silicon nitride, silicon carbide, silicon nitride carbide, aluminum nitride, a metal oxide (such as aluminum oxide, titanium oxide, tantalum oxide, etc.), or the like. In some embodiments, the upper-level etch stop dielectric layer 524 physically contacts a top surface of the first upper ILD layer 126$U_1$. In various embodiments, the upper-level etch stop dielectric layer 524 may have a thickness 525 that is in a range of between approximately 4 nanometers (nm) and approximately 20 nm, between approximately 10 nm and approximately 15 nm, approximately 12.5 nm, or other similar values.

A first dielectric matrix layer 526 is disposed over the upper-level etch stop dielectric layer 524 and a second dielectric matrix layer 528 is disposed over the first dielectric matrix layer 526. In some embodiments, the first dielectric matrix layer 526 may include, for example, silicon nitride, silicon carbide, silicon nitride carbide, aluminum nitride, a metal oxide (such as aluminum oxide, titanium oxide, tantalum oxide, etc.), or the like. In some embodiments, the second dielectric matrix layer 528 may include, for example, Tetraethyl orthosilicate (TEOS), USG, BPSG, FSG, PSG, BSG, or the like. In some embodiments, a cumulative thickness of the first dielectric matrix layer 526 and the second dielectric matrix layer 528 may be in a range of between approximately 15 nm and approximately 60 nm, between approximately 20 nm and approximately 40 nm, or other similar values. In some embodiments, the first dielectric matrix layer 526 may have a thickness 527 that is in a range of between approximately 4 nm and approximately 8 nm, approximately 6 nm, or other similar values. In some embodiments, the second dielectric matrix layer 528 may have a thickness 529 that is in a range of between approximately 10 nm and approximately 20 nm, approximately 16 nm, or other similar values.

A common electrode 522 is disposed within the upper-level etch stop dielectric layer 524 and the at least one dielectric matrix layer 526-528. The common electrode 522 continuously extends over the plurality of memory device 104. In some embodiments, the common electrode 522 continuously extends past outermost edges of the plurality of memory devices 104. In some embodiments, the common electrode 522 directly physically contacts the top electrodes 104*c* of the plurality of memory devices 104.

A cap-level etch stop dielectric layer 530 is arranged over the least one dielectric matrix layer 526-528 and the common electrode 522. In some embodiments, the cap-level etch stop dielectric layer 530 includes silicon nitride, silicon carbide, silicon nitride carbide, aluminum nitride, a metal oxide (such as aluminum oxide, titanium oxide, tantalum oxide, etc.), or the like. In some embodiments, the cap-level etch stop dielectric layer 530 may physically contact a top surface of the at least one dielectric matrix layer 526-528. In some embodiments, the cap-level etch stop dielectric layer 530 may have a thickness 531 that is in a range of between approximately 4 nm and approximately 20 nm, between approximately 10 nm and approximately 15 nm, approximately 12.5 nm, or other similar values.

An upper-level dielectric layer 532 is disposed on the cap-level etch stop dielectric layer 530. The upper-level dielectric layer 532 may include TEOS, USG, BPSG, FSG, PSG, BSG, or the like. In some embodiments, a thickness 533 of the upper-level dielectric layer 532 may be in a range of between approximately 5 nm and approximately 20 nm, between approximately 8 nm and approximately 12 nm, approximately 10 nm, or other similar values. A plurality of local interconnect vias 534 are disposed within the cap-level etch stop dielectric layer 530 and the upper-level dielectric layer 532. The plurality of local interconnect vias 534 contact a top of the common electrode 522.

A second upper ILD layer 126$U_2$ is arranged on the upper-level dielectric layer 532. A local interconnect 116 is disposed within the second upper ILD layer 126$U_2$. A plurality of interconnect vias 130 are disposed on the local interconnect 116 and are surrounded by a third upper ILD layer 126$U_3$. The plurality of interconnect vias 130 couple the local interconnect 116 to a bit-line 110 that is within the third upper ILD layer 126$U_3$. In various embodiments, the second upper ILD layer 126$U_2$ and/or the third upper ILD layer 126$U_3$ may comprise USG, BPSG, FSG, PSG, BSG, or the like. In various embodiments, the local interconnect 116, the plurality of interconnect vias 130, and/or the bit-line 110 may comprise aluminum, copper, tungsten, and/or the like.

In some embodiments, a peripheral interconnect via 536 is arranged within the peripheral region 136 of the substrate 122. The peripheral interconnect via 536 is disposed within the dielectric structure 126 outside of the memory array 102. The peripheral interconnect via 536 vertically extends past at least a part of the common electrode 522 and the plurality of local interconnect vias 534.

Figure 6A:
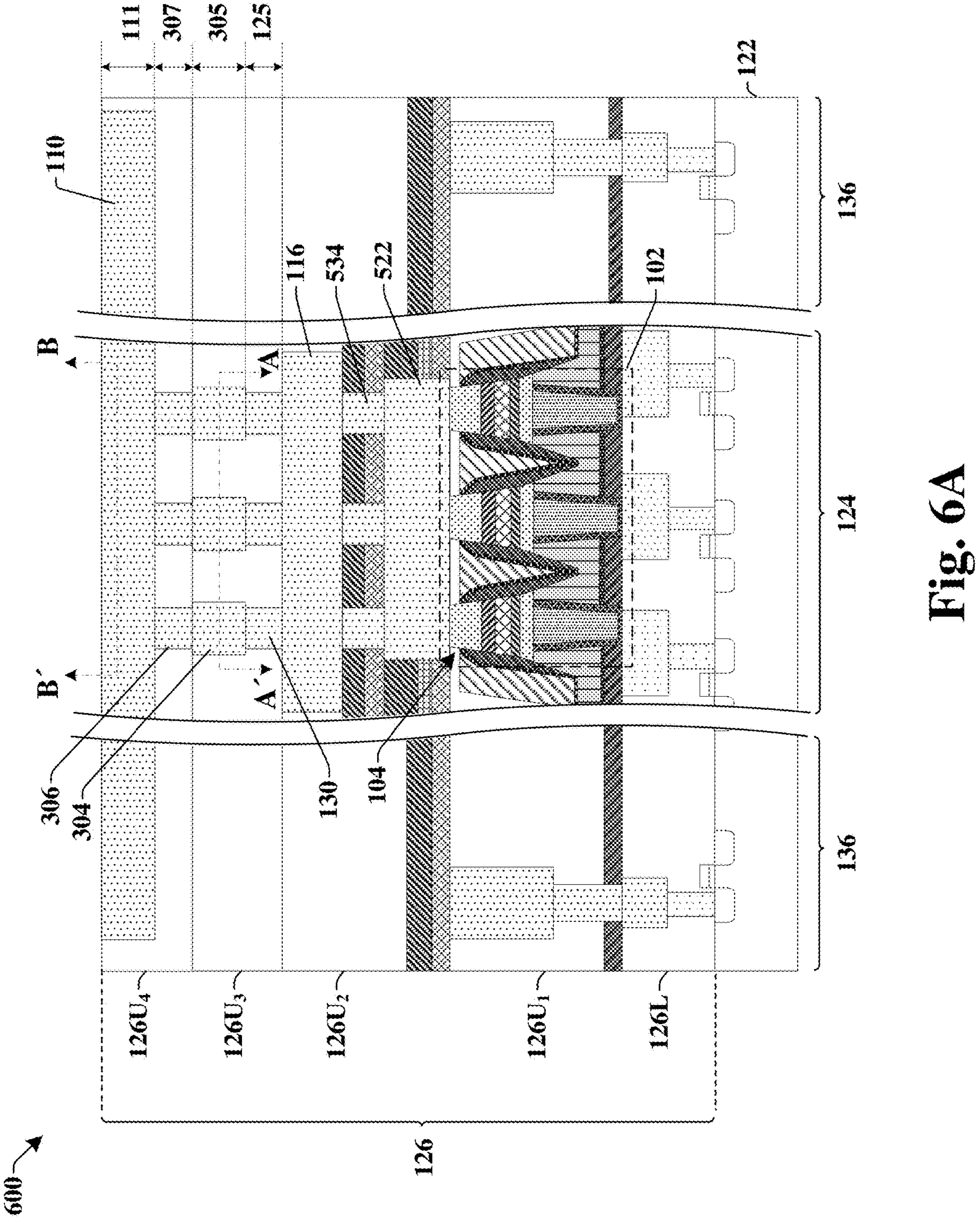
FIGS. 6A-6C illustrate some additional embodiments of an integrated chip structure comprising a memory array having a local interconnect configured to reduce a resistance of a bit-line.

FIG. 6A illustrates a cross-sectional view of some additional embodiments of an integrated chip structure 600 comprising a memory array having a local interconnect configured to reduce a resistance of a bit-line.

The integrated chip structure 600 comprises an embedded memory region 124 and a peripheral region 136. A memory array 102 is disposed within the embedded memory region 124. The memory array 102 comprises a plurality of memory devices 104 disposed within a first upper ILD layer 126$U_1$ of a dielectric structure 126 over a substrate 122. A local interconnect 116 is arranged within a second upper ILD layer 126$U_2$ and is coupled to the plurality of memory devices 104 by way of a common electrode 522 and a plurality of local interconnect vias 534. The local interconnect 116 continuously extends laterally past the plurality of memory devices 104.

The local interconnect 116 is coupled to an overlying bit-line 110 by way of a plurality of interconnect vias 130, a plurality of interconnect islands 304, and a plurality of additional upper interconnect vias 306. The plurality of interconnect vias 130 physically contact the local interconnect 116 and the plurality of interconnect islands 304. The plurality of additional upper interconnect vias 306 physically contact the plurality of interconnect islands 304 and the bit-line 110. In some embodiments, the plurality of interconnect vias 130 and the plurality of interconnect islands 304 are disposed within a third upper ILD layer 126$U_3$, while the plurality of additional upper interconnect vias 306 and the bit-line 110 are disposed within a fourth upper ILD layer 126$U_4$.

In some embodiments, the plurality of interconnect vias 130 may have a first height 125 that is in a range of between approximately 25 nm and approximately 100 nm, between approximately 50 nm and approximately 90 nm, or other similar values. In some embodiments, the plurality of interconnect islands 304 may have a second height 305 that is in a range of between approximately 25 nm and approximately 100 nm, between approximately 50 nm and approximately 90 nm, or other similar values. In some embodiments, the plurality of additional upper interconnect vias 306 may have a third height 307 that is in a range of between approximately 40 nm and approximately 130 nm, between approximately 50 nm and approximately 120 nm, or other similar values. In some embodiments, the bit-line 110 may have a fourth height 111 that is in a range of between approximately 40 nm and approximately 130 nm, between approximately 50 nm and approximately 120 nm, or other similar values.

Figure 6B:
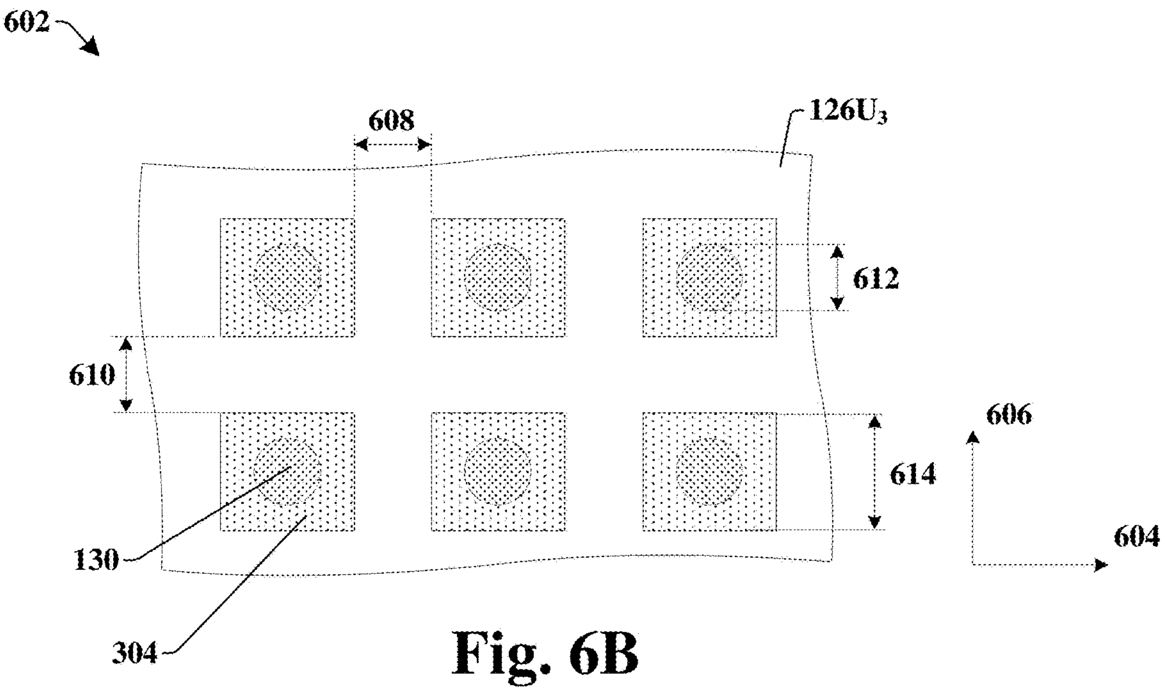

FIG. 6B illustrates a top-view 602 of some additional embodiments of the integrated chip structure 600 taken along cross-sectional line A-A' of FIG. 6A.

As shown in top-view 602, the plurality of interconnect vias 130 are disposed within a boundary of the plurality of interconnect islands 304. In some embodiments, the plurality of interconnect vias 130 may be set back from the boundary along a first direction 604 and/or along a second direction 606 that is perpendicular to the first direction 604. In some embodiments, the plurality of interconnect islands 304 may be square shaped. In other embodiments, the plurality of interconnect islands 304 may be rectangular shaped, or other similar shapes.

In some embodiments, the plurality of interconnect islands 304 may be separated from one another by a first distance 608 along the first direction 604 and by a second distance 610 along the second direction 606. In some embodiments, the first distance 608 and/or the second distance 610 may be in a range of between approximately 10 nm and approximately 100 nm, between approximately 20 nm and approximately 80 nm, or other similar values. In some embodiments, the plurality of interconnect islands 304 may have a width 614 that is in a range of between approximately 10 nm and approximately 70 nm, between approximately 20 nm and approximately 50 nm, or other similar values.

In some embodiments, the plurality of interconnect vias 130 may have a circular shape. In other embodiments, the plurality of interconnect vias 130 may have a square shape, a rectangular shape, or other similar shapes. In some embodiments, the plurality of interconnect vias 130 may have a width 612 that is in a range of between approximately 10 nm and approximately 100 nm, between approximately 20 nm and approximately 80 nm, or other similar values.

Figure 6C:
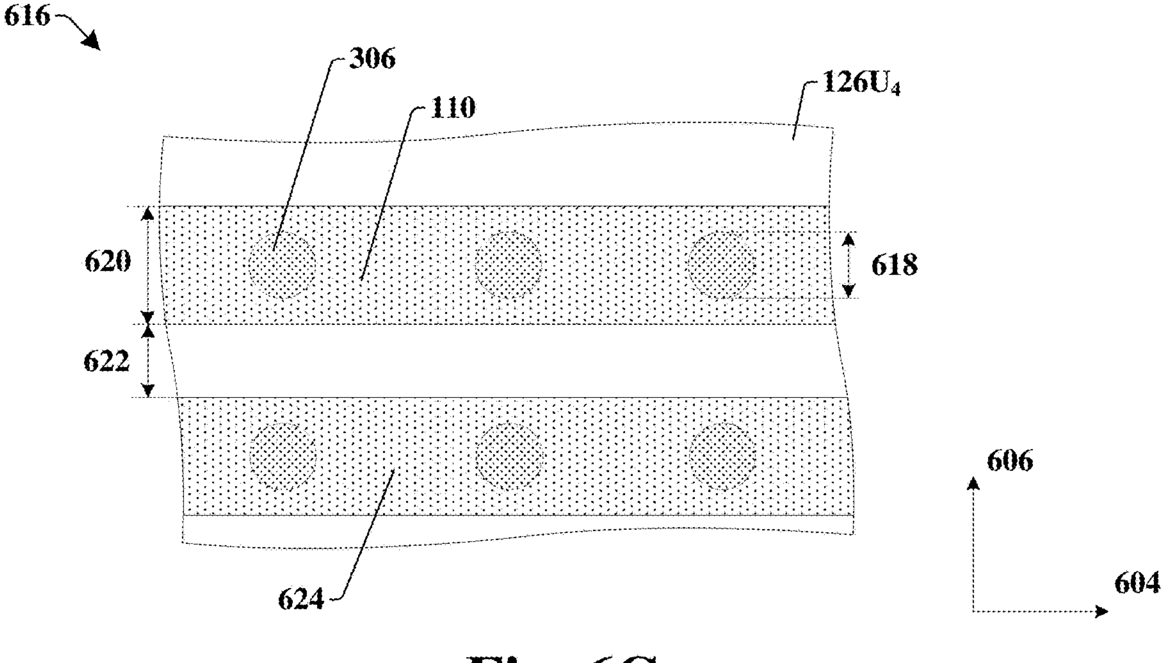

FIG. 6C illustrates a top-view 616 of some additional embodiments of the integrated chip structure 600 taken along cross-sectional line B-B' of FIG. 6A.

As shown in top-view 616, the bit-line 110 continuously extends past the plurality of additional upper interconnect vias 306 along the first direction 604 along the second direction 606. In some embodiments, the bit-line 110 may have a width 620 that is in a range of between approximately 10 nm and approximately 200 nm, between approximately 20 nm and approximately 160 nm, or other similar values. In some embodiments, the bit-line 110 may be separated from an additional bit-line 624 by a third distance 622 along the second direction 606. In some embodiments, the third distance 622 may be in a range of between approximately 10 nm and approximately 200 nm, between approximately 20 nm and approximately 160 nm, or other similar values.

In some embodiments, the plurality of additional upper interconnect vias 306 may have a circular shape. In other embodiments, the plurality of additional upper interconnect vias 306 may have a square shape, a rectangular shape, or other similar shapes. In some embodiments, the plurality of additional upper interconnect vias 306 may have a width 618 that is in a range of between approximately 10 nm and approximately 100 nm, between approximately 20 nm and approximately 80 nm, or other similar values.

Figure 7:
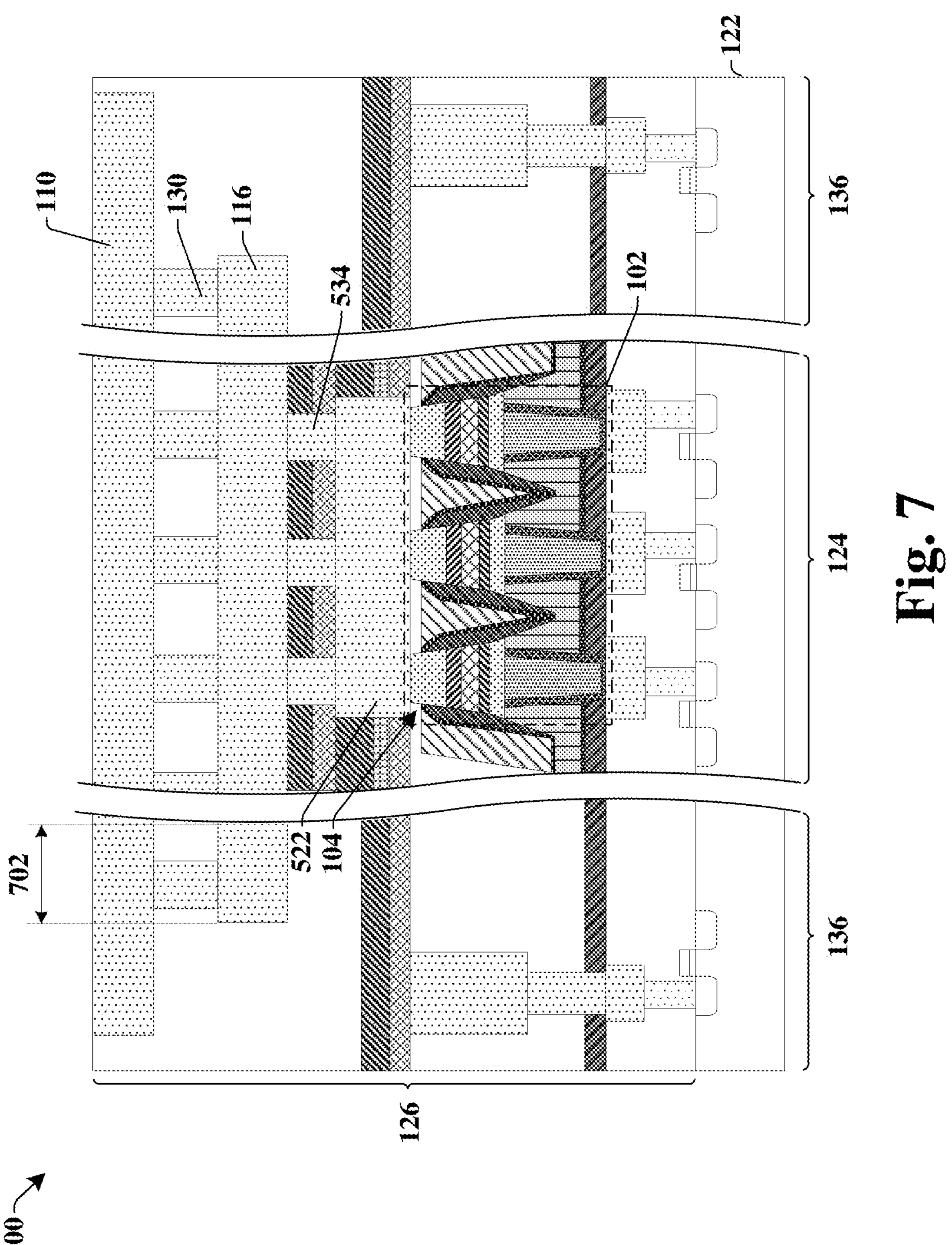
FIG. 7 illustrates a cross-sectional view of some additional embodiments of an integrated chip structure comprising a memory array having a local interconnect configured to reduce a resistance of a bit-line.

FIG. 7 illustrates a cross-sectional view of some additional embodiments of an integrated chip structure 700 comprising a memory array having a local interconnect configured to reduce a resistance of a bit-line.

The integrated chip structure 700 comprises an embedded memory region 124 and a peripheral region 136. A memory array 102, comprising a plurality of memory devices 104, is disposed within a dielectric structure 126 within the embedded memory region 124. A local interconnect 116 is arranged within the dielectric structure 126 and is coupled to the plurality of memory devices 104. The local interconnect 116 is arranged vertically between the plurality of memory devices 104 and the bit-line 110. The local interconnect 116 comprises a bottom surface that continuously extends laterally past the plurality of memory devices 104.

The local interconnect 116 is coupled to an overlying bit-line 110 by way of a plurality of interconnect vias 130. The plurality of interconnect vias 130 have bottom surfaces that physically contact the local interconnect 116 and top surfaces that physically contact the bit-line 110. In some embodiments, the local interconnect 116 continuously extends from within the embedded memory region 124 to within the peripheral region 136. In some such embodiments, plurality of interconnect vias 130 may also extend from within the embedded memory region 124 to a non-zero distance 702 within the peripheral region 136. By extending to the non-zero distance 702 within the embedded memory region 124, the local interconnect 116 is able to further reduce a resistance of the bit-line 110.

Figure 8:
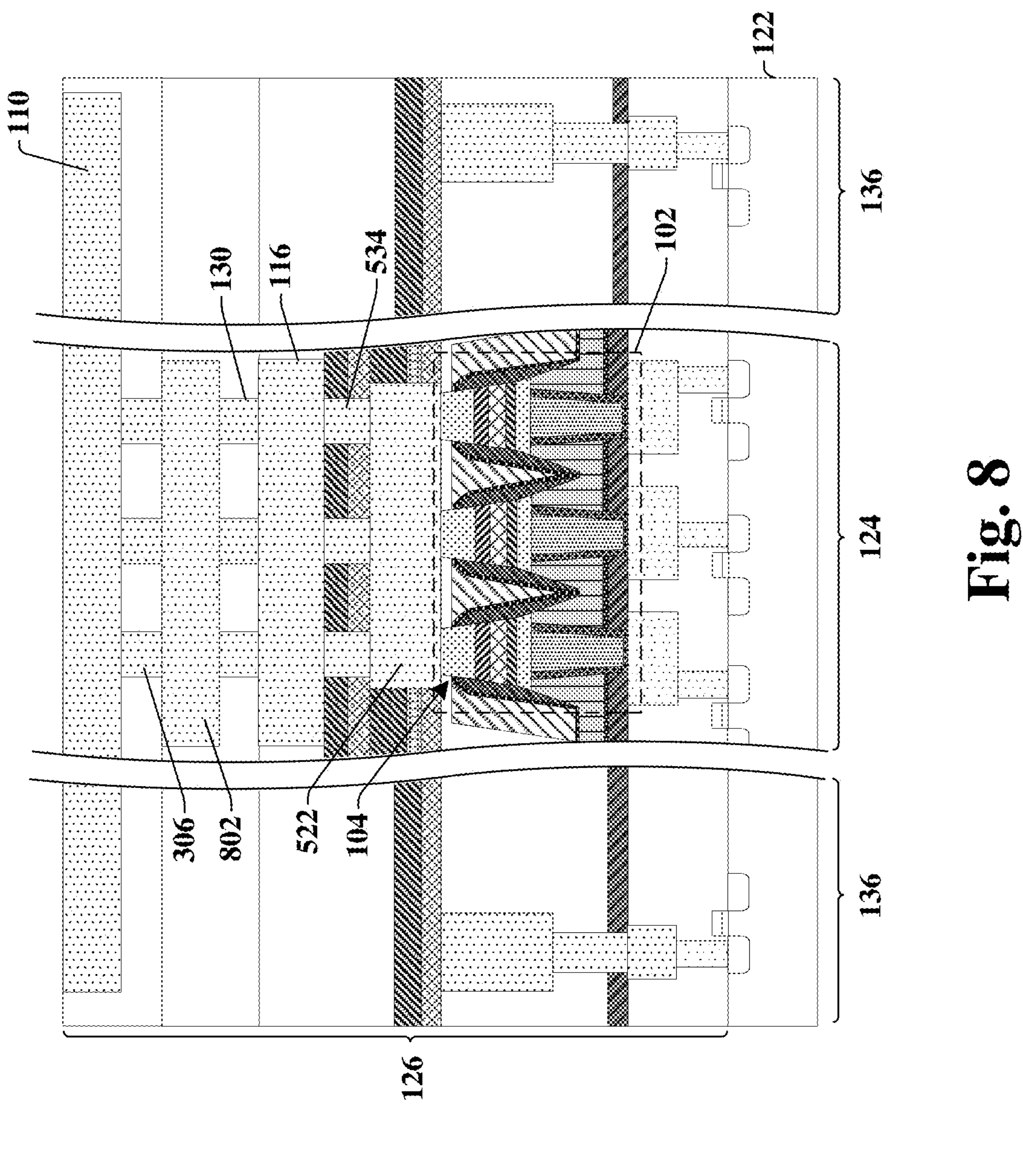
FIG. 8 illustrates a cross-sectional view of some additional embodiments of an integrated chip structure comprising a memory array having a local interconnect configured to reduce a resistance of a bit-line.

FIG. 8 illustrates a cross-sectional view of some additional embodiments of an integrated chip structure 800 comprising a memory array having a local interconnect configured to reduce a resistance of a bit-line.

The integrated chip structure 800 comprises an embedded memory region 124 and a peripheral region 136. A memory array 102 is disposed within the embedded memory region 124. The memory array 102 comprises a plurality of memory devices 104 disposed within a dielectric structure 126 over a substrate 122. A local interconnect 116 is arranged within the dielectric structure 126 and is coupled to the plurality of memory devices 104. The local interconnect 116 is arranged vertically between the substrate 122 and the bit-line 110.

The local interconnect 116 is coupled to an overlying bit-line 110 by way of a plurality of interconnect vias 130, an additional interconnect wire 802, and a plurality of additional upper interconnect vias 306. The additional interconnect wire 802 is coupled to and extends in parallel to both the local interconnect 116 and the bit-line 110. The plurality of interconnect vias 130 have bottom surfaces that physically contact the local interconnect 116. The additional interconnect wire 802 has a bottom surface that physically contacts top surfaces of the plurality of interconnect vias 130 and a top surface that physically contacts the plurality of additional upper interconnect vias 306. The plurality of additional upper interconnect vias 306 couple the additional interconnect wire 802 to the bit-line 110.

Figure 9A:
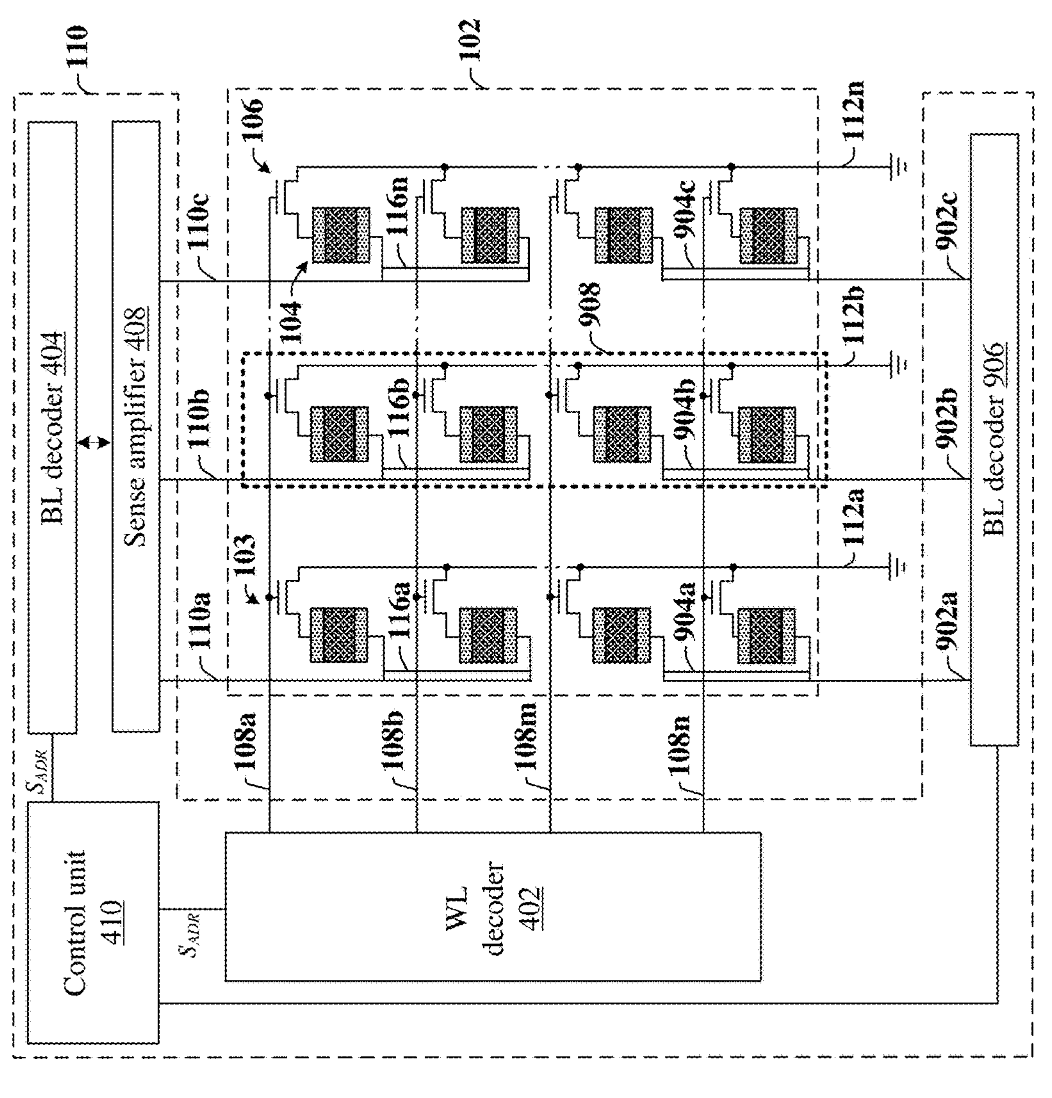
FIGS. 9A-9B illustrate some additional embodiments of an integrated chip structure comprising a memory array having a local interconnect configured to reduce a resistance of a bit-line.

FIG. 9A illustrates a schematic diagram 900 of some embodiments of an integrated chip structure comprising a memory array having a local interconnect configured to reduce a resistance of a bit-line.

As shown in the schematic diagram 900, the integrated chip structure comprises a memory array 102 including a plurality of memory cells 103 arranged within rows and/or columns. The plurality of memory cells 103 comprise a plurality of memory devices 104 and a plurality of access devices 106 configured to control access to the plurality of memory devices 104. A first set of the plurality of memory devices 104 within a row respectively have access devices 106 that are operably coupled to one of a plurality of word-lines 108*a*-108*n*. A second set of the plurality of memory devices 104 within a column are operably coupled to one of a plurality of bit-lines 110*a*-110*n*. A third set of the plurality of memory devices 104 within the column are operably coupled to one of a plurality of additional bit-lines 902*a*-902*n*. In some embodiments, the plurality of memory devices 104 within a column are further coupled to one of a plurality of source-lines 112*a*-112*n*.

A plurality of local interconnects 116*a*-116*n* are respectively coupled to the plurality of bit-lines 110*a*-110*n* and to the second set of the plurality of memory devices 104 within the column of the memory array 102. The plurality of local interconnects 116*a*-116*n* extends in parallel to the plurality of bit-lines 110*a*-110*n*. An additional plurality of local interconnects 904*a*-904*n* are also respectively coupled to the plurality of additional bit-lines 902*a*-902*n* and to the third set of the plurality of memory devices 104 within the column of the memory array 102.

The plurality of word-lines 108*a*-108*n*, the plurality of bit-lines 110*a*-110*n*, and the plurality of additional bit-lines 902*a*-902*n* are coupled to control circuitry 114. In some embodiments, the control circuitry 114 comprises a word-line decoder 402 coupled to the plurality of word-lines 108*a*-108*n*, a bit-line decoder 404 coupled to the plurality of bit-lines 110*a*-110*n*, and an additional bit-line decoder 906 coupled to the plurality of additional bit-line 902*a*-902*n*. In some such embodiments, the bit-line decoder 404 is configured to provide a signal to the plurality of bit-lines 110*a*-110*n* during an access operation and the additional bit-line decoder 906 is configured to provide an additional signal to the plurality of additional bit-line 902*a*-902*n* during an additional access operation. In some alternative embodiments (not shown), the control circuitry 114 may comprise a bit-line decoder 404 coupled to both the plurality of bit-lines 110*a*-110*n* and the plurality of additional bit-line 902*a*-902*n*. In some such embodiments, the bit-line decoder 404 is configured to provide signals to both the plurality of bit-lines 110*a*-110*n* and the plurality of additional bit-line 902*a*-902*n* during an access operation.

By having the plurality of memory devices 104 within a column of the memory array 102 coupled to both the bit-line 110*a* and the additional bit-line 902*a*, a distance that the bit-line 110*a* and the additional bit-line 902*a* span can be reduced thereby reducing a resistance of the bit-line 110*a* and the additional bit-line 902*a*. Furthermore, by having the bit-line 110*a* and the additional bit-line 902*a* respectively coupled to the local interconnect 116*a* and the additional local interconnect 904*a*, a resistance of the bit-line 110*a* and the additional bit-line 902*a* can be further reduced.

Figure 9B:
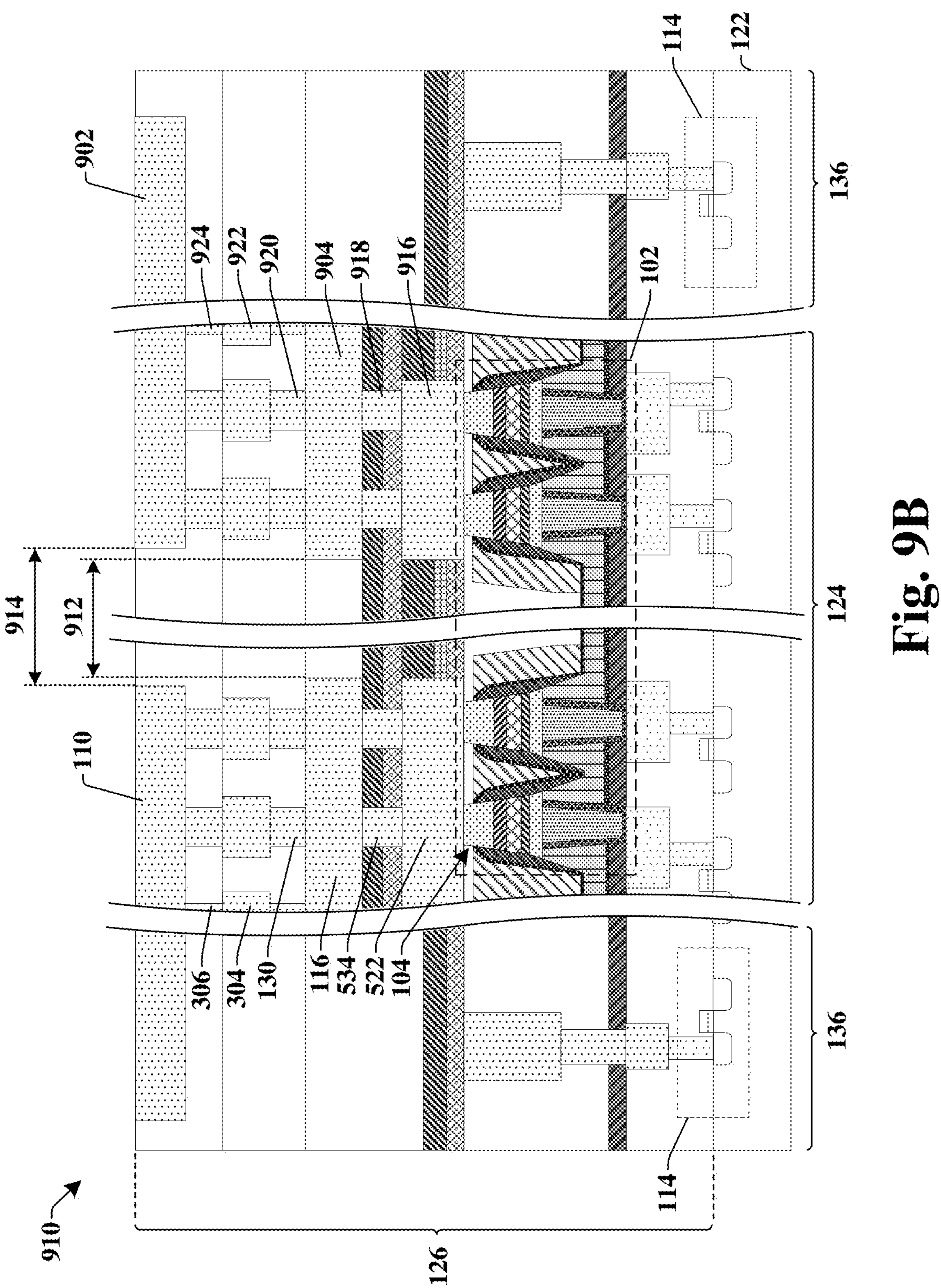

FIG. 9B illustrates a cross-sectional view of some additional embodiments of an integrated chip structure 910 corresponding to section 908 of the schematic diagram 900 shown in FIG. 9A.

The integrated chip structure 910 comprises an embedded memory region 124 and a peripheral region 136. A memory array 102 is disposed within the embedded memory region 124. The memory array 102 comprises a plurality of memory devices 104 disposed within a dielectric structure 126 over a substrate 122.

A local interconnect 116 is arranged within the dielectric structure 126 and is coupled to a second set of the plurality of memory devices 104. The local interconnect 116 is arranged vertically between the second set of the plurality of memory devices 104 and a bit-line 110. The local interconnect 116 comprises a bottom surface that continuously extends laterally past the second set of the plurality of memory devices 104. An additional local interconnect 904 is arranged within the dielectric structure 126 and is coupled to a third set of the plurality of memory devices 104. The additional local interconnect 904 is arranged vertically between the third set of the plurality of memory devices 104 and an additional bit-line 902. The additional local interconnect 904 comprises a bottom surface that continuously extends laterally past the third set of the plurality of memory devices 104.

In some embodiments, the additional local interconnect 904 is coupled to an additional common electrode 916 by way of a plurality of additional local interconnect vias 918. In some embodiments, the additional common electrode 916 physically contacts the third set of the plurality of memory devices 104. The additional local interconnect 904 is further coupled to the additional bit-line 902 by way of a plurality of additional interconnect vias 920, a plurality of additional interconnect islands 922 that are on the plurality of additional interconnect vias 920, and a second plurality of additional upper interconnect vias 924 that are on the plurality of additional interconnect islands 922.

The local interconnect 116 comprises an end that is laterally separated from an end of the additional local interconnect 904 by a first non-zero distance 912 that is laterally between the second set of the plurality of memory devices 104 and the third set of the plurality of memory devices 104. The bit-line 110 also comprises an end that is laterally separated from an end of the additional bit-line 902 by a second non-zero distance 914. In some embodiments, the first non-zero distance 912 may be approximately equal to the second non-zero distance 914. In other embodiments, the first non-zero distance 912 and second non-zero distance 914 may be different. The separation between the local interconnects and the bit-lines reduces a length of the local interconnects and the bit-lines, thereby reducing a resistance of the bit-lines and further improving a performance of the integrated chip structure 910.

FIGS. 10-29 illustrate cross-sectional views 1000-2900 showing some embodiments of a method of forming an integrated chip structure comprising a memory array having a local interconnect configured to reduce a resistance of a bit-line. Although FIGS. 10-29 are described in relation to a method, it will be appreciated that the structures disclosed in FIGS. 10-29 are not limited to such a method, but instead may stand alone as structures independent of the method.

Figure 10:
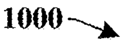
FIGS. 10-29 illustrate cross-sectional views showing some embodiments of a method of forming an integrated chip structure comprising a memory array having a local interconnect configured to reduce a resistance of a bit-line.
Figure 10:
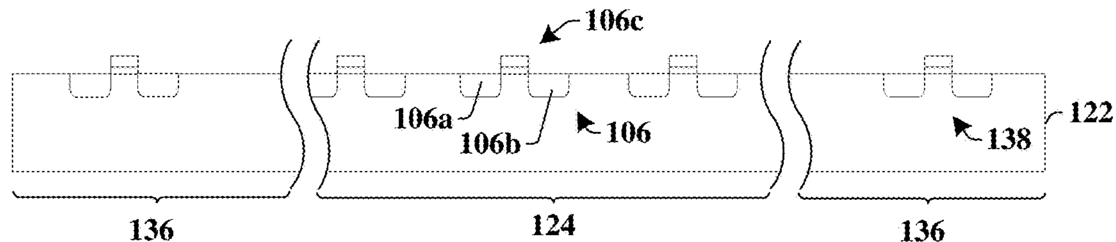

As shown in cross-sectional view 1000 of FIG. 10, a substrate 122 is provided. In various embodiments, the substrate 122 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 122 may comprise one or more dielectric layers, one or more inter-level dielectric (ILD) layers, and/or one or more interconnect layers disposed over a semiconductor body. In some embodiments, the substrate 122 may comprise an embedded memory region 124 and a peripheral region 136.

In some embodiments, an access device 106 is formed on the substrate 122 and within the embedded memory region 124. In some embodiments, a transistor device 138 is formed on the substrate 122 and within the peripheral region 136. In some embodiments, the access device 106 may comprise a gate structure 106*c* formed over the substrate 122. In such embodiments, the gate structure 106*c* may be formed by depositing a gate dielectric over the substrate 122 and depositing a gate electrode over the gate dielectric. The gate electrode and the gate dielectric are subsequently patterned to form the gate structure 106*c*. A source region 106*a* and a drain region 106*b* may be formed within the substrate 122 on opposing sides of the gate structure 106*c* by an implantation process. In some embodiments, the access device 106 may be formed within an active area defined by one or more isolation structures (e.g., shallow trench isolation (STI) structures) disposed within the substrate 122.

Figure 11:
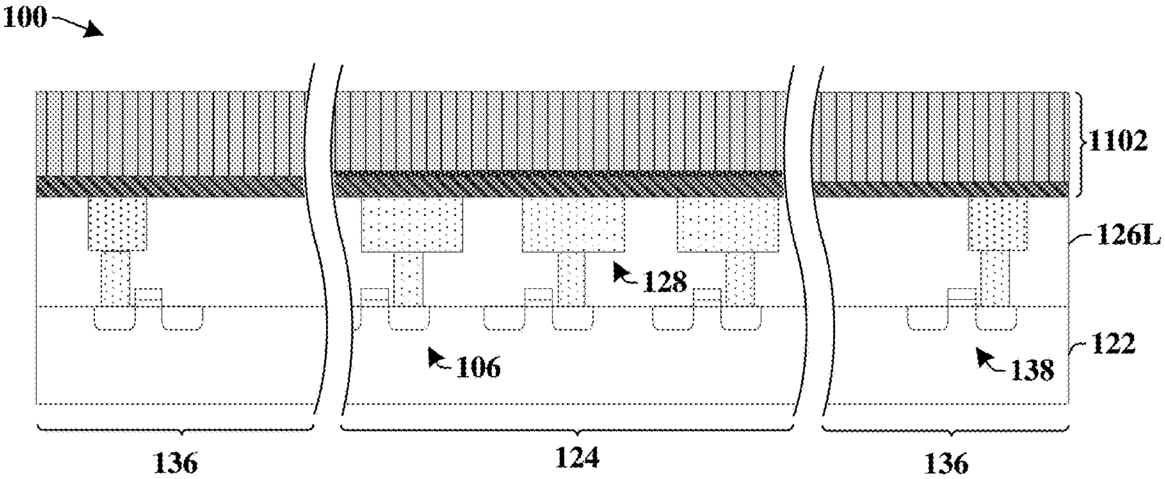

As shown in cross-sectional view 1100 of FIG. 11, a plurality of lower interconnects 128 are formed within a lower ILD structure 126L formed on the substrate 122. In some embodiments, the plurality of lower interconnects 128 may be formed using a damascene process (e.g., a single damascene process or a dual damascene process). The damascene process is performed by forming an ILD layer over the substrate 122, etching the ILD layer to form a via hole and/or a trench, and filling the via hole and/or trench with a conductive material. In some embodiments, the ILD layer may comprise USG, BPSG, FSG, PSG, BSG, or the like, formed by a deposition technique (e.g., PVD, CVD, PE-CVD, ALD, etc.), In some embodiments, the conductive material may comprise tungsten, copper, aluminum, copper, or the like, formed using a deposition process and/or a plating process (e.g., electroplating, electro-less plating, etc.).

An intermediate lower insulating structure 1102 is formed over the one or more lower interconnects 128 and/or the lower ILD structure 126L. In some embodiments, the intermediate lower insulating structure 1102 comprises one or more of silicon rich oxide, silicon carbide, silicon nitride, and/or the like. In some embodiments, the intermediate lower insulating structure 1102 may be formed by one or more deposition processes (e.g., a physical vapor deposition (PVD) process, a chemical vapor deposition (CVD) process, a plasma enhanced CVD (PE-CVD) process, or the like).

Figure 12:
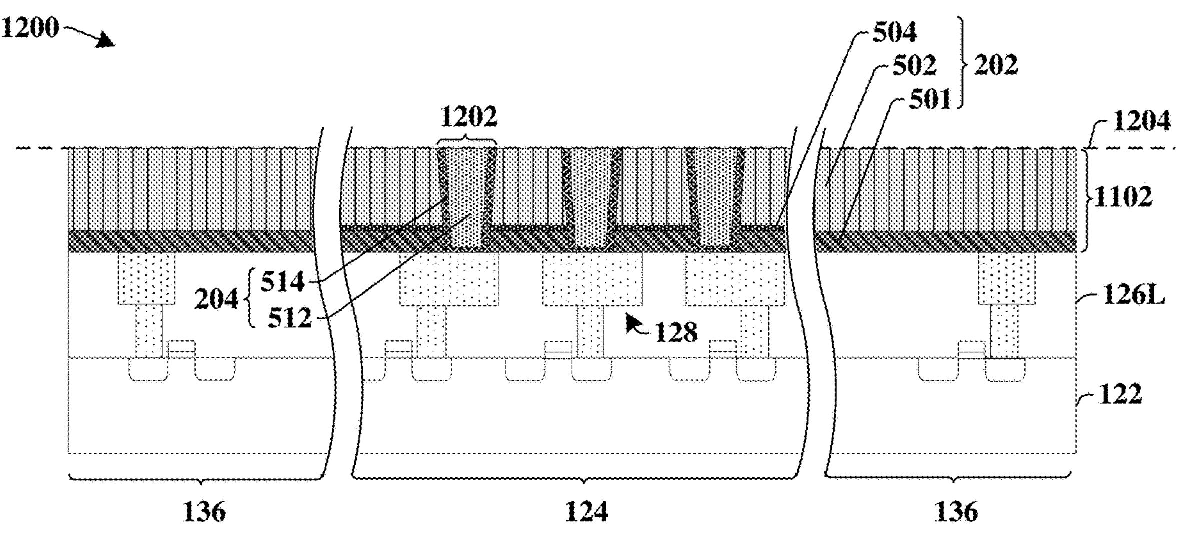

As shown in cross-sectional view 1200 of FIG. 12, a bottom electrode via 204 is formed within the intermediate lower insulating structure 1102. In some embodiments, the bottom electrode via 204 may be formed by selectively etching the intermediate lower insulating structure 1102 to form an opening 1202 that extends through the intermediate lower insulating structure 1102 to expose an upper surface of the one or more lower interconnects 128. In some embodiments, the opening 1202 may be subsequently filled with a conductive material to form a bottom electrode via 204 that extends through the intermediate lower insulating structure 1102. In some embodiments, the bottom electrode via 204 may comprise a diffusion barrier layer 514 and a conductive core 512 formed over the diffusion barrier layer 514. In some embodiments, the diffusion barrier layer 514 may comprise one or more of a metal, a metal nitride, and/or the like. In some embodiments, the conductive core 512 may comprise tungsten, tantalum nitride, titanium nitride, ruthenium, platinum, iridium, or the like. In some embodiments, the diffusion barrier layer 514 and the conductive core 512 may be formed by deposition processes (e.g., a PVD process, a CVD process, a PE-CVD process, or the like). In some embodiments, a planarization process 1204 (e.g., a chemical mechanical planarization (CMP) process) be performed to remove excess of the diffusion barrier layer 514 and the conductive core 512 from over the intermediate lower insulating structure 1102.

Figure 13:
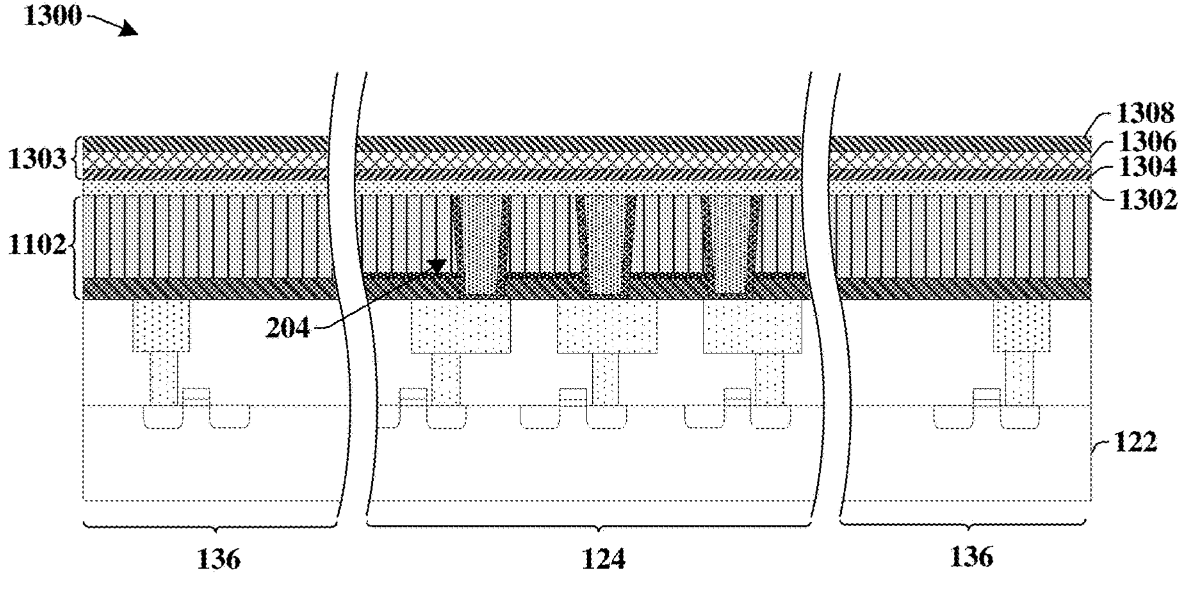

As shown in cross-sectional view 1300 of FIG. 13, a bottom electrode structure 1302 is formed over the intermediate lower insulating structure 1102 and a memory device stack 1303 is formed over the bottom electrode structure 1302. In some embodiments, the bottom electrode structure 1302 may comprise a metal, such as tantalum, titanium, tantalum nitride, titanium nitride, platinum, nickel, hafnium, zirconium, ruthenium, iridium, or the like. In some embodiments, the memory device stack 1303 may comprise a pinned layer 1304 formed over the bottom electrode structure 1302, a dielectric barrier tunnel layer 1306 formed over the pinned layer 1304, and a free layer 1308 formed over the dielectric barrier tunnel layer 1306. In other embodiments (not shown), the free layer 1308 may be formed over the bottom electrode structure 1302, the dielectric barrier tunnel layer 1306 formed over the free layer 1308, and the pinned layer 1304 may be formed over the dielectric barrier tunnel layer 1306.

Figure 14:
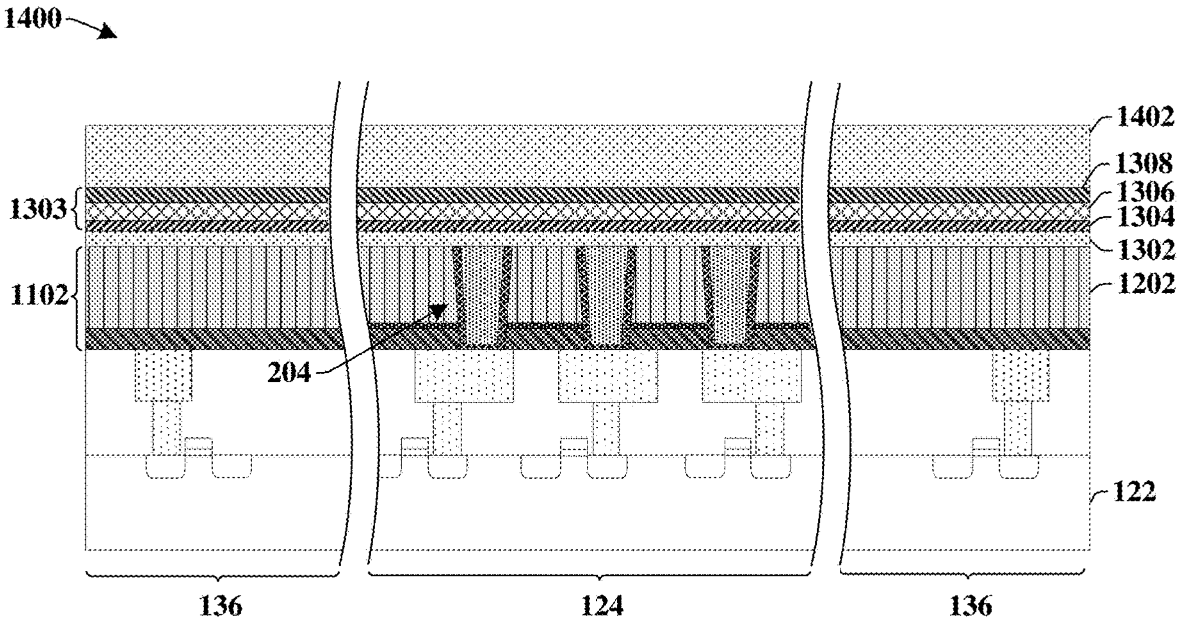

As shown in cross-sectional view 1400 of FIG. 14, a top electrode structure 1402 is formed over the memory device stack 1303. In some embodiments, the top electrode structure 1402 may comprise a metal, such as tantalum, titanium, tantalum nitride, titanium nitride, platinum, nickel, hafnium, zirconium, ruthenium, iridium, or the like. In some embodiments, the top electrode structure 1402 may be formed by one or more deposition processes (e.g., a PVD process, a CVD process, a PE-CVD process, or the like).

Figure 15:
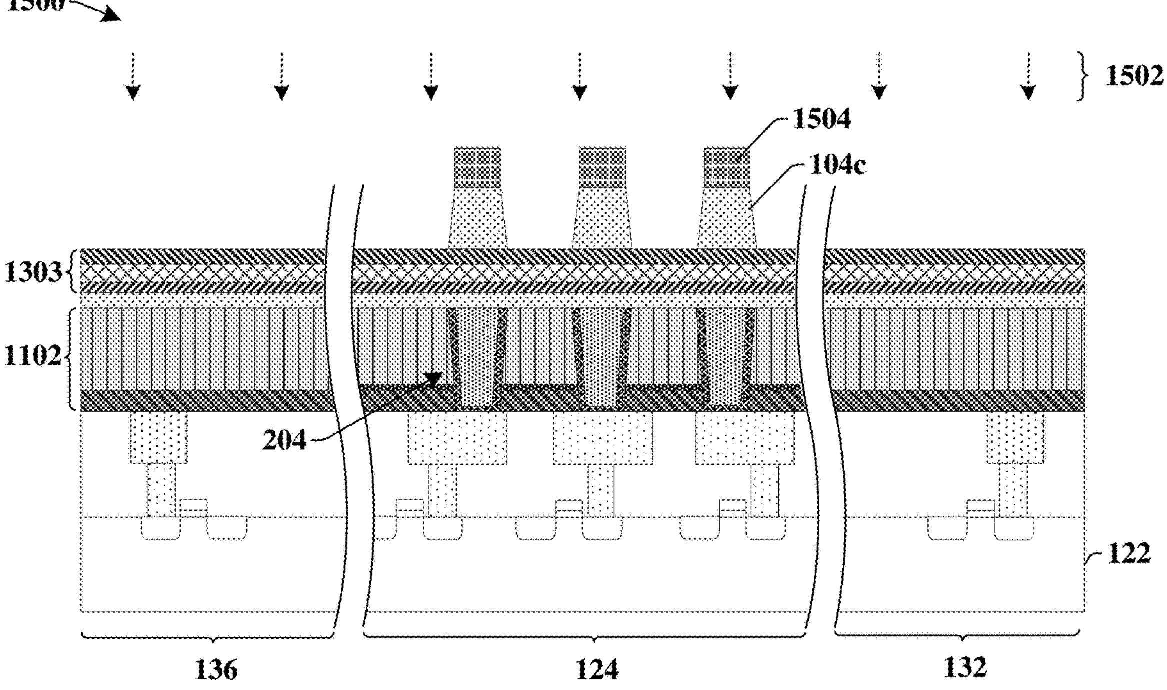

As shown in cross-sectional view 1500 of FIG. 15, the top electrode structure (e.g., 1402 of FIG. 14) is selectively patterned to define a top electrode 104*c*. In some embodiments, the top electrode structure may be selectively patterned by exposing the top electrode structure to an etchant 1502 according to a mask layer 1504 (e.g., silicon nitride, silicon carbide, or the like).

Figure 16:
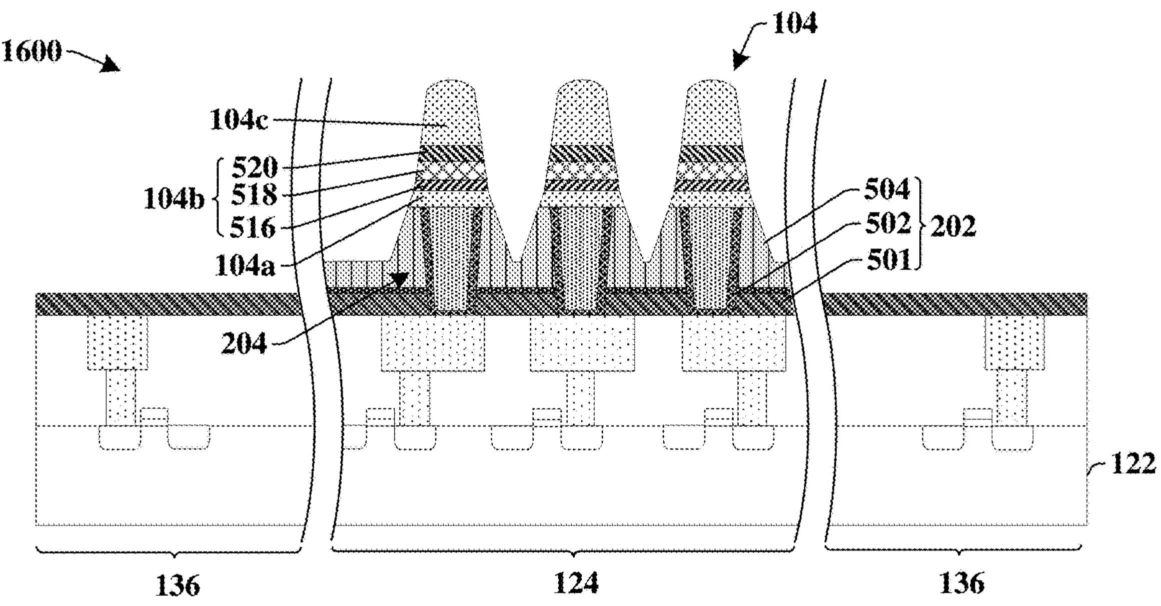

As shown in cross-sectional view 1600 of FIG. 16, the memory device stack (e.g., 1303 of FIG. 15) and the bottom electrode structure (e.g., 1302 of FIG. 15) are selectively patterned to define a memory device 104 having data storage structure 104*b* disposed between a bottom electrode 104*a* and the top electrode 104*c*. In some embodiments, the memory device stack may be selectively etched according to the mask layer (1504 of FIG. 15) and/or the top electrode 104*c* to define the data storage structure 104*b* and the bottom electrode 104*a*.

In some embodiments, the intermediate lower insulating structure (1102 of FIG. 15) may also be etched to define a lower insulating structure 202. The lower insulating structure 202 comprises a first lower insulating layer 501, a second lower insulating layer 502 over the first lower insulating layer, and a third lower insulating layer 504 over the second lower insulating layer. In some embodiments, the second lower insulating layer 502 and the third lower insulating layer 504 may be confined within the embedded memory region 124.

Figure 17:
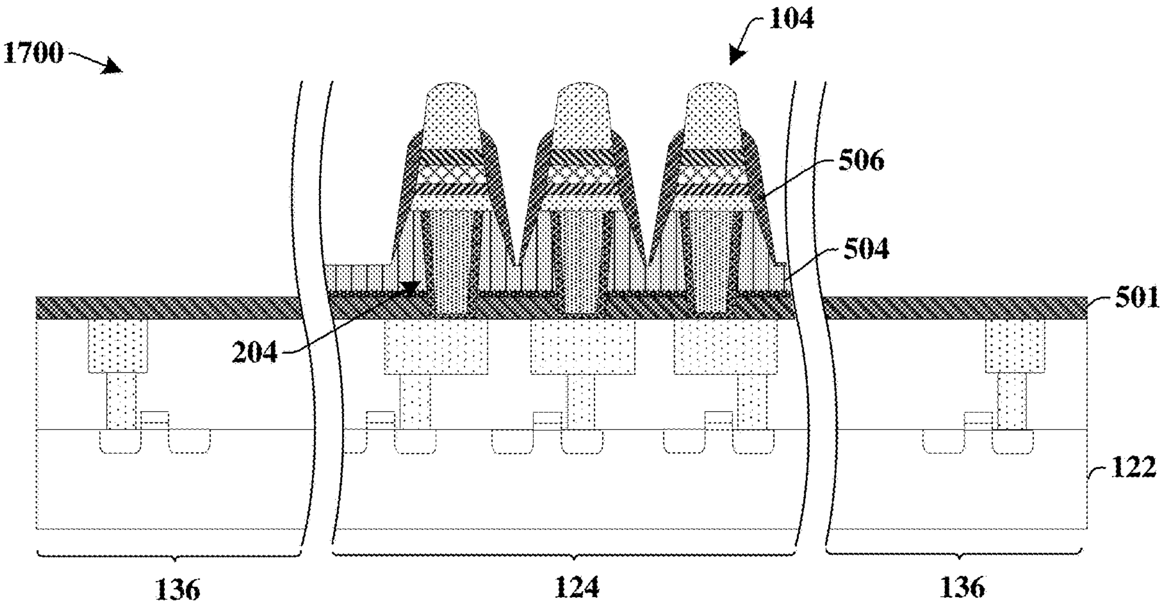

As shown in cross-sectional view 1700 of FIG. 17, a first sidewall spacer layer 506 is formed along sidewalls of the memory device 104. In some embodiments, the first sidewall spacer layer 506 may comprise a first dielectric material such as silicon nitride, silicon oxide, or the like. In some embodiments, the first dielectric material may be deposited using a deposition process (e.g., a PVD process, a CVD process, a PE-CVD process, or the like). An etch process (e.g., an anisotropic etch process) may be subsequently performed to remove horizontal portions of the first dielectric material. The first dielectric material may be formed to a thickness that is in a range of between approximately 2 nm and approximately 20 nm, between approximately 4 nm and approximately 10 nm, or other similar values.

Figure 18:
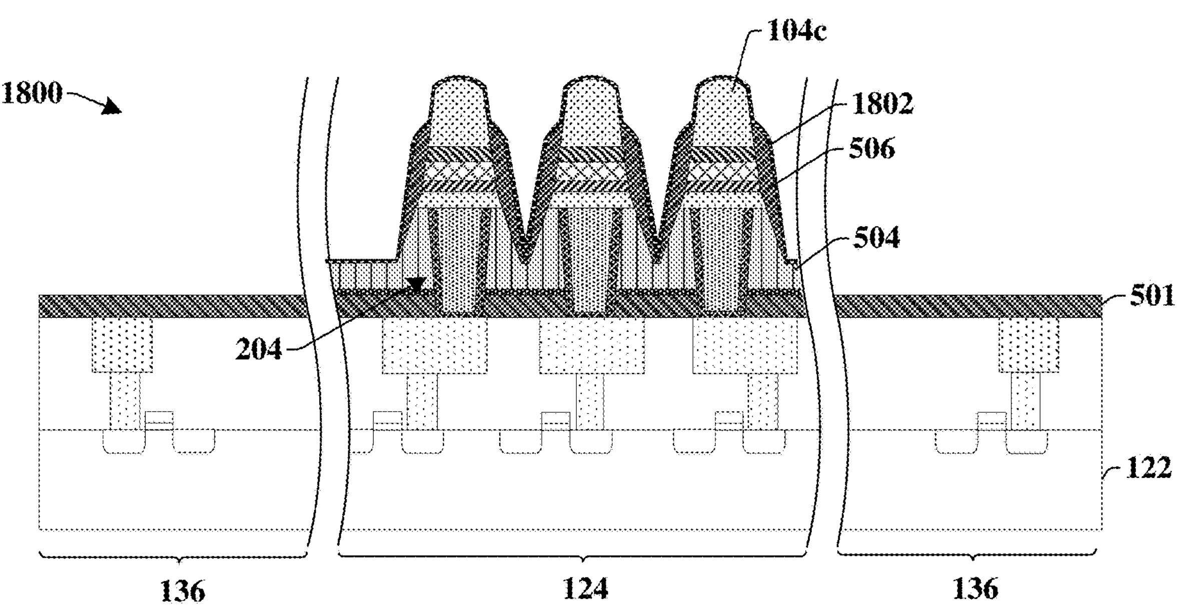

As shown in cross-sectional view 1800 of FIG. 18, an intermediate second sidewall spacer layer 1802 is on the first sidewall spacer layer 506 and the top electrode 104*c*. In some embodiments, the intermediate second sidewall spacer layer 1802 may comprise a second dielectric material such as a dielectric metal oxide such as aluminum oxide, hafnium oxide, lanthanum oxide, or yttrium oxide. In some embodiments, the second dielectric material may be deposited using a deposition process (e.g., a PVD process, a CVD process, a PE-CVD process, or the like). The second dielectric material may be formed to a thickness that is in a range of between approximately 2 nm and approximately 20 nm, between approximately 4 nm and approximately 10 nm, or other similar values. In one embodiment, the second dielectric material may be deposited directly on sidewalls of the top electrode 104*c*.

Figure 19:
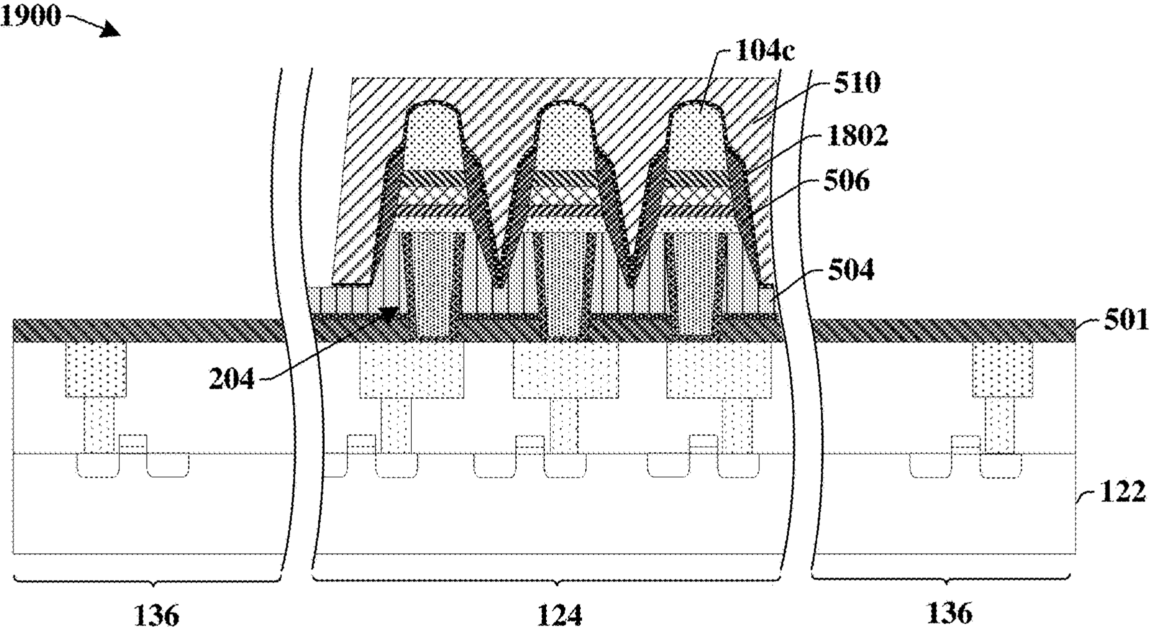

As shown in cross-sectional view 1900 of FIG. 19, a dielectric encapsulation structure 510 is formed over the intermediate second sidewall spacer layer 1802. In some embodiments, the dielectric encapsulation structure 510 may comprise silicon oxide, silicon nitride, or a dielectric metal oxide. In some embodiments, the dielectric encapsulation structure 510 may be formed by depositing a dielectric encapsulation material (e.g., by a conformal deposition process such as an atomic layer deposition process or a chemical vapor deposition process), and subsequently etching (e.g., anisotropically etching) the dielectric encapsulation material to remove the dielectric encapsulation material from the peripheral region 136. In one embodiment, a top surface of the dielectric encapsulation structure 510 may be located above a top of the top electrode 104*c*.

Figures 20, 21:
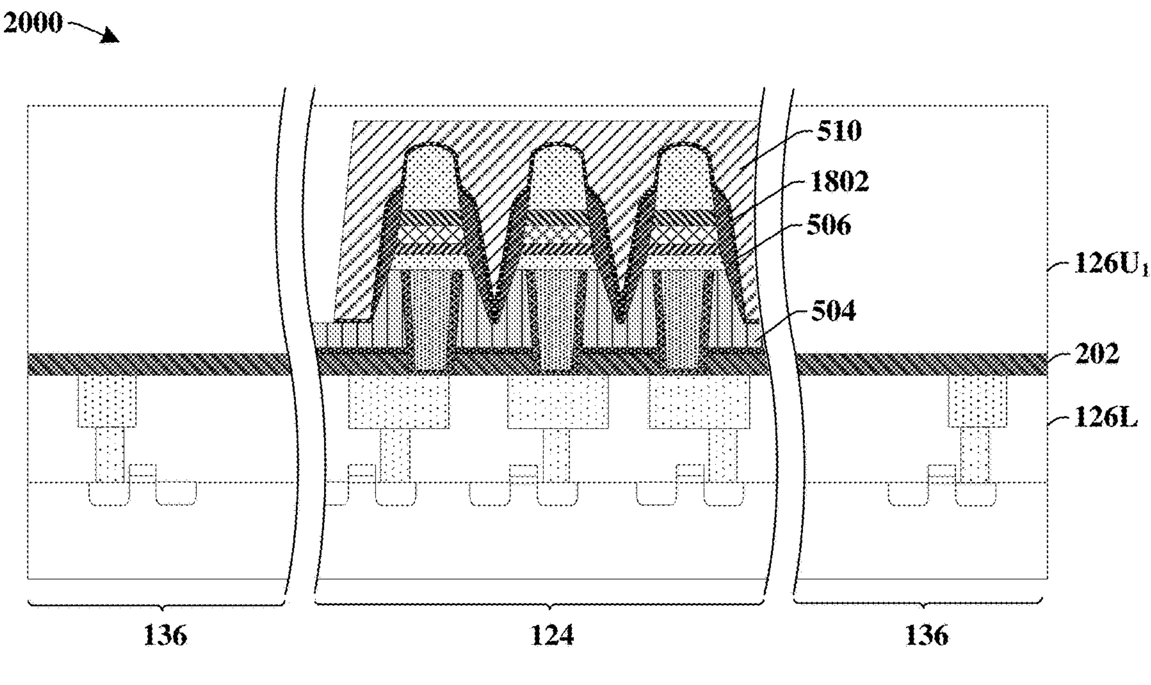

As shown in cross-sectional view 2000 of FIG. 20, a first upper ILD layer 126$U_1$ is formed over the dielectric encapsulation structure 510. In some embodiments, the first upper ILD layer 126$U_1$ may comprise USG, BPSG, FSG, PSG, BSG, or the like. In some embodiments, the first upper ILD layer 126$U_1$ may be formed by way of a deposition process (e.g., PVD, CVE, PE-CVD, ALD, or the like).

As shown in cross-sectional view 2100 of FIG. 21, one or more peripheral interconnects 140 are formed within the peripheral region 136. In some embodiments, the one or more peripheral interconnects 140 may be formed by way of a damascene process and/or a dual damascene process. In some such embodiments, the first upper ILD layer 126$U_1$ is etched to form holes and/or trenches, which are subsequently filled with a conductive material (e.g., tungsten, copper, and/or aluminum). A planarization process 2102 (e.g., a CMP process) is subsequently performed to remove excess of the conductive material from over the first upper ILD layer 126$U_1$.

Figure 22:
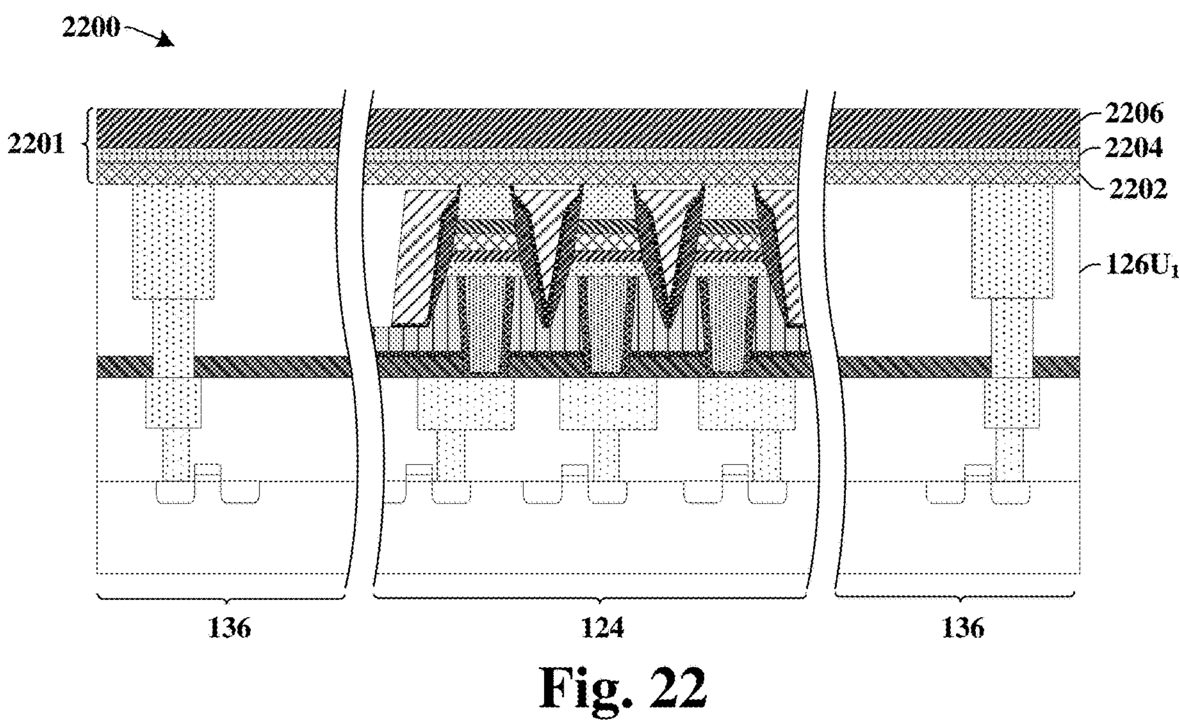

As shown in cross-sectional view 2200 of FIG. 22, a first dielectric stack 2201 is formed over the first upper ILD layer 126$U_1$. In some embodiments, the first dielectric stack 2201 may comprise an intermediate upper-level etch stop dielectric layer 2202 formed over the first upper ILD layer 126$U_1$, an intermediate first dielectric matrix layer 2204 formed over the intermediate upper-level etch stop dielectric layer 2202, and an intermediate second dielectric matrix layer 2206 formed over the intermediate first dielectric matrix layer 2204. In some embodiments, the intermediate upper-level etch stop dielectric layer 2202 may comprise silicon nitride, silicon carbide, silicon nitride carbide, aluminum nitride, a metal oxide (such as aluminum oxide, titanium oxide, tantalum oxide, etc.), or the like, formed by one or more deposition processes (e.g., a PVD process, a CVD process, a PE-CVD process, or the like). In some embodiments, the intermediate first dielectric matrix layer 2204 may comprise silicon nitride, silicon carbide, silicon nitride carbide, aluminum nitride, a metal oxide (such as aluminum oxide, titanium oxide, tantalum oxide, etc.), or the like, formed by one or more deposition processes (e.g., a PVD process, a CVD process, a PE-CVD process, or the like). In some embodiments, the intermediate second dielectric matrix layer 2206 may comprise TEOS, USG, BPSG, FSG, PSG, BSG, or the like, formed by one or more deposition processes (e.g., a PVD process, a CVD process, a PE-CVD process, or the like).

Figure 23:
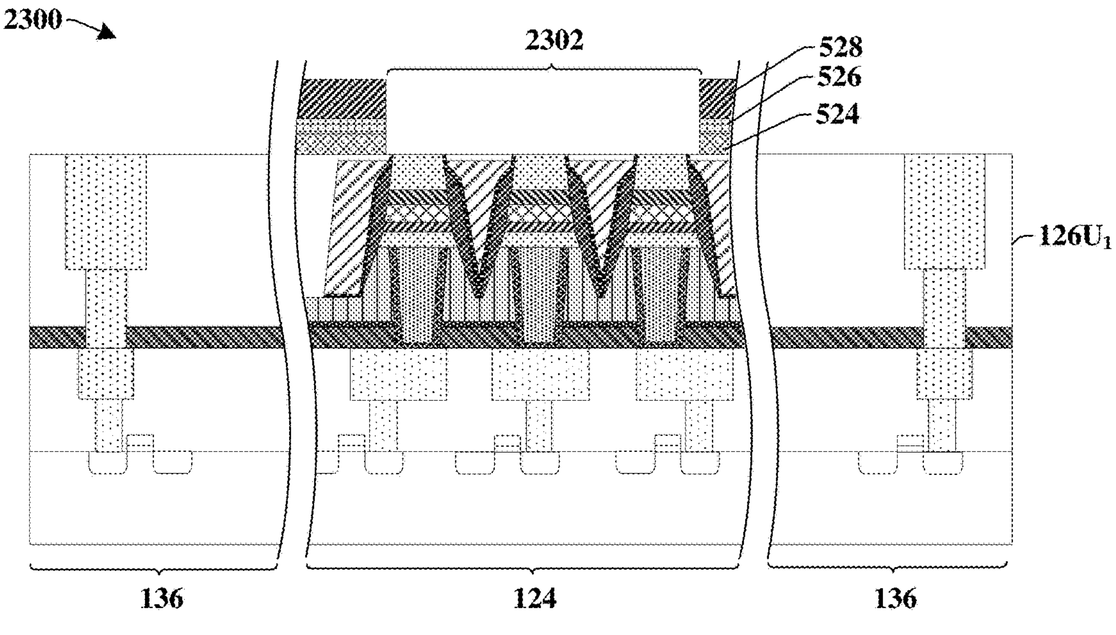

As shown in cross-sectional view 2300 of FIG. 23, the intermediate upper-level etch stop dielectric layer (2202 of FIG. 22), the intermediate first dielectric matrix layer (2204 of FIG. 22), and the intermediate second dielectric matrix layer (2206 of FIG. 22) are selectively patterned to form an upper-level etch stop dielectric layer 524, a first dielectric matrix layer 526, and a second dielectric matrix layer 528. The upper-level etch stop dielectric layer 524, the first dielectric matrix layer 526, and the second dielectric matrix layer 528 respectively have sidewalls that define a common electrode opening 2302 that exposes upper surfaces of the top electrode 104*c* within the plurality of memory devices 104.

Figure 24:
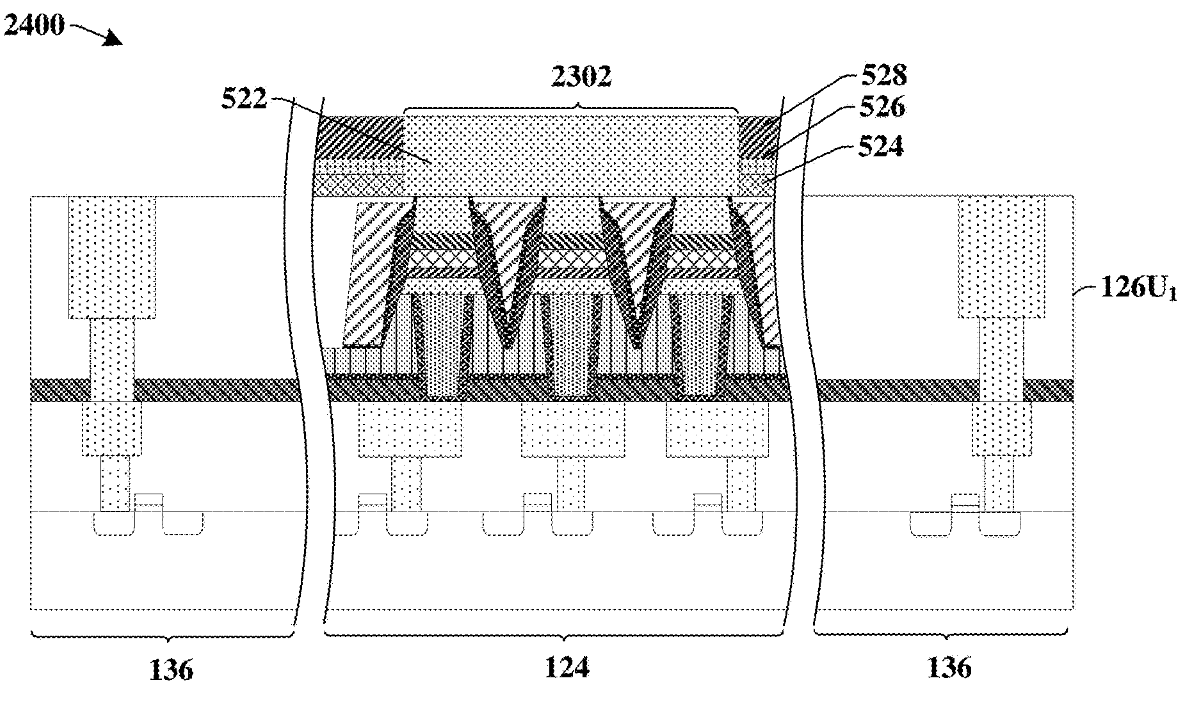

As shown in cross-sectional view 2400 of FIG. 24, a common electrode 522 is formed within the common electrode opening 2302. In some embodiments, the common electrode 522 may be formed by depositing a conductive material (e.g., tungsten, copper, and/or aluminum) within the common electrode opening 2302. A planarization process 2102 (e.g., a chemical CMP process) is subsequently performed to remove excess of the conductive material from over the second dielectric matrix layer 528.

Figure 25:
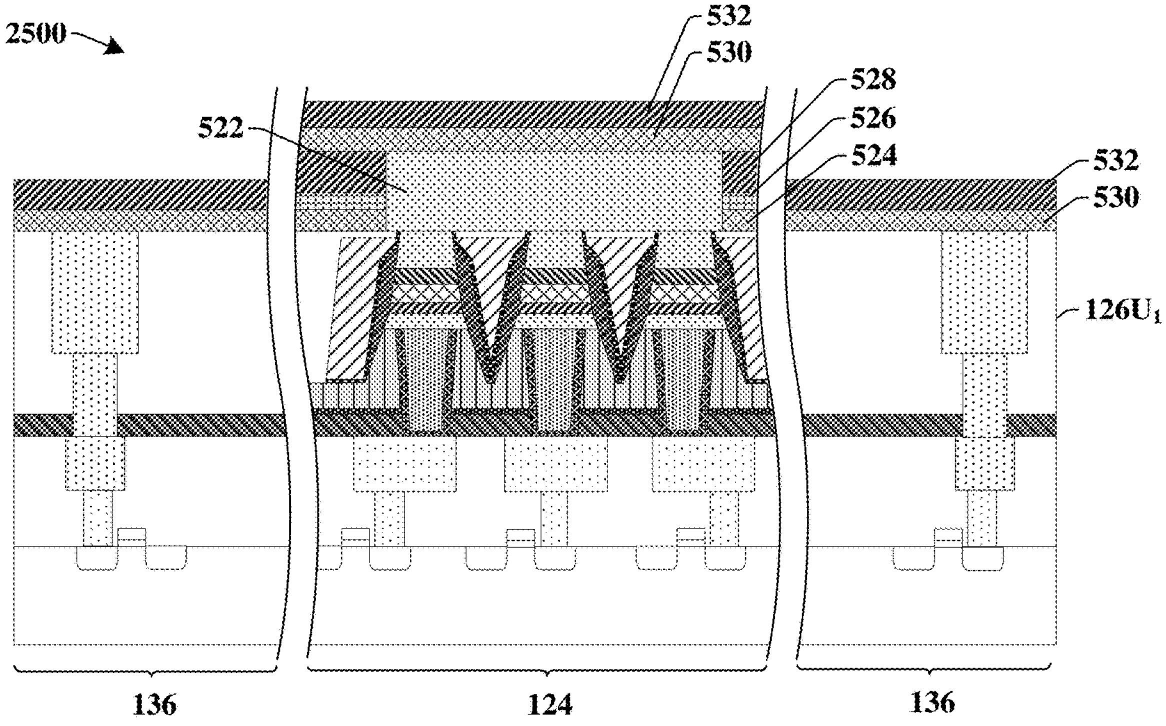

As shown in cross-sectional view 2500 of FIG. 25, a cap-level etch stop dielectric layer 530 is formed over the common electrode 522 and an upper-level dielectric layer 532 is formed over the cap-level etch stop dielectric layer 530. In some embodiments, the cap-level etch stop dielectric layer 530 may comprise silicon nitride, silicon carbide, silicon nitride carbide, aluminum nitride, a metal oxide (such as aluminum oxide, titanium oxide, tantalum oxide, etc.), or the like, formed by one or more deposition processes (e.g., a PVD process, a CVD process, a PE-CVD process, or the like). In some embodiments, the upper-level dielectric layer 532 may comprise TEOS, USG, BPSG, FSG, PSG, BSG, or the like, formed by one or more deposition processes (e.g., a PVD process, a CVD process, a PE-CVD process, or the like). In some embodiments, the cap-level etch stop dielectric layer 530 and the upper-level dielectric layer 532 may be formed to continuously extend from over the common electrode 522 to within the peripheral region 136.

Figure 26:
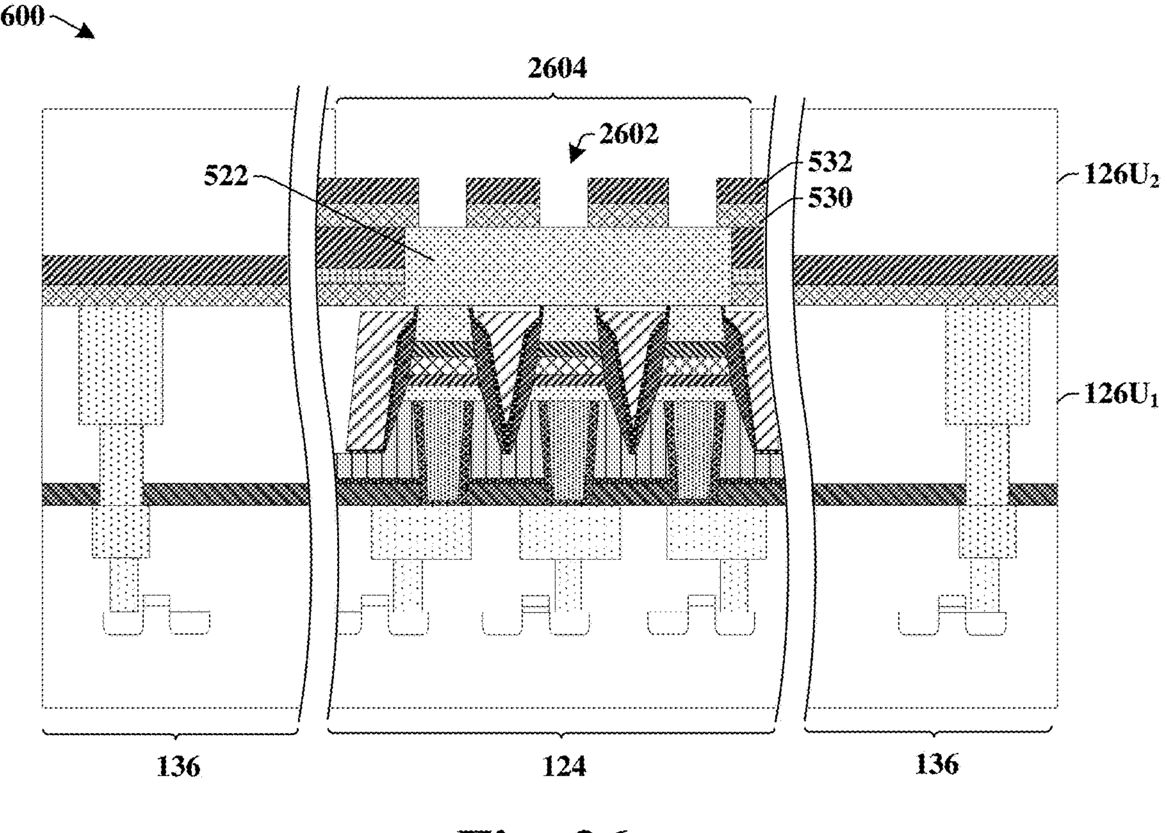

As shown in cross-sectional view 2600 of FIG. 26, a second upper ILD layer 126$U_2$ is formed over the upper-level dielectric layer 532. In some embodiments, the second upper ILD layer 126$U_2$ may comprise TEOS, USG, BPSG, FSG, PSG, BSG, or the like, formed by one or more deposition processes (e.g., a PVD process, a CVD process, a PE-CVD process, or the like).

The cap-level etch stop dielectric layer 530, the upper-level dielectric layer 532, and the second upper ILD layer 126$U_2$ are selectively patterned to form a plurality of interconnect via openings 2602 and a local interconnect opening 2604 that expose an upper surface of common electrode 522. The plurality of local interconnect via openings 2602 are defined by sidewalls of the cap-level etch stop dielectric layer 530 and the upper-level dielectric layer 532, while the local interconnect opening 2604 is defined by sidewalls of the second upper ILD layer 126$U_2$. The local interconnect opening 2604 extends laterally past plurality of interconnect via openings 2602 and past opposing edges of the plurality of memory devices 104.

Figure 27:
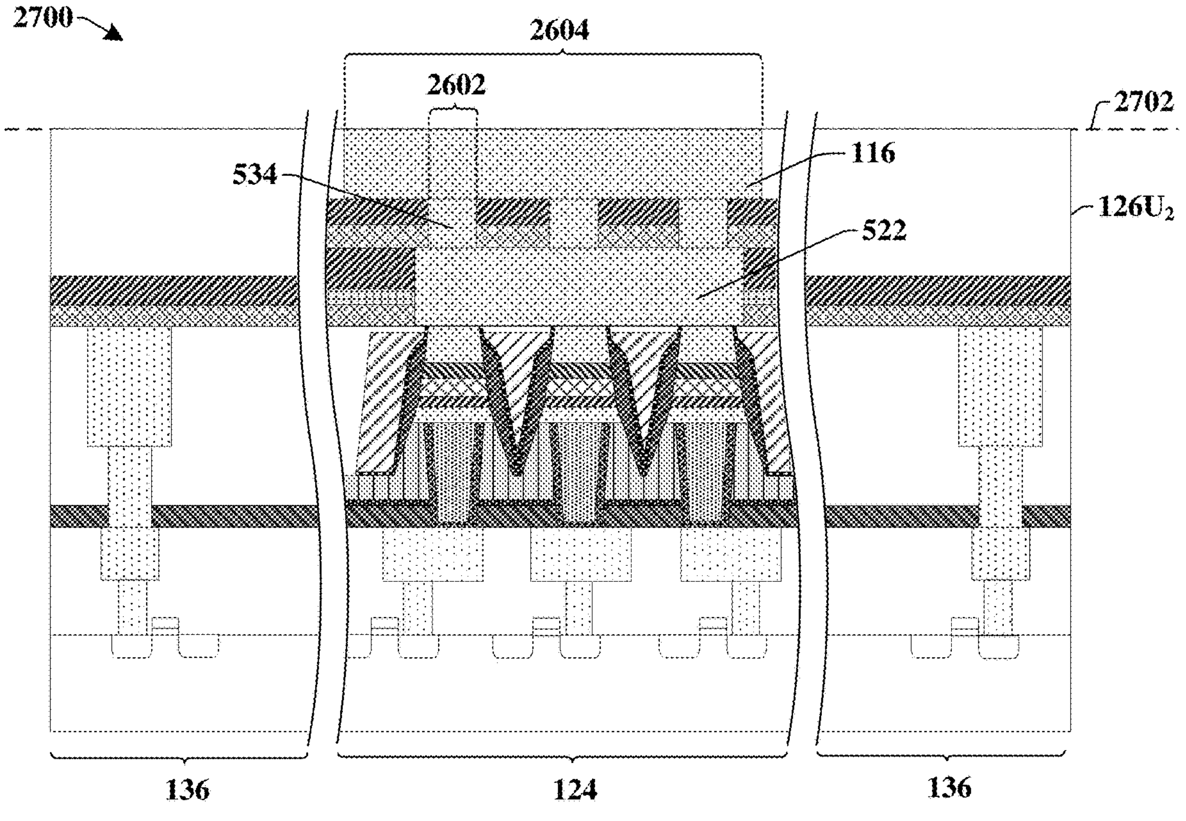

As shown in cross-sectional view 2700 of FIG. 27, a plurality of local interconnect vias 534 are formed within the plurality of local interconnect via openings 2602 and a local interconnect 116 is formed within the local interconnect opening 2604. In some embodiments, the plurality of local interconnect vias 534 and/or the local interconnect 116 may be formed by depositing a conductive material (e.g., tungsten, copper, and/or aluminum) within the plurality of local interconnect via openings 2602 and the local interconnect opening 2604. A planarization process 2702 (e.g., a CMP process) is subsequently performed to remove excess of the conductive material from over the second upper ILD layer 126$U_2$.

Figure 28:
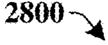
Figure 28:
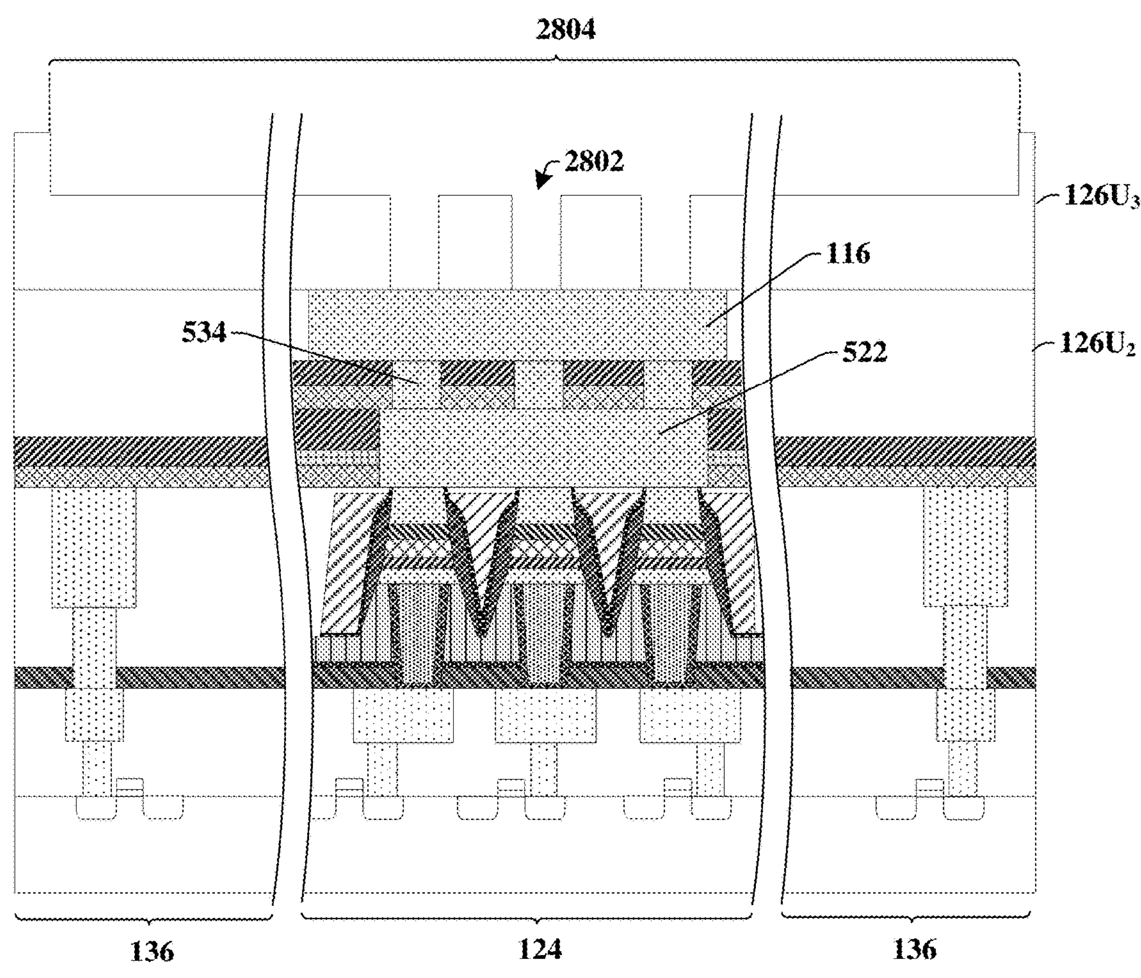

As shown in cross-sectional view 2800 of FIG. 28, a third upper ILD layer 126$U_3$ is formed over the second upper ILD layer 126$U_2$. In some embodiments, the third upper ILD layer 126$U_3$ may comprise TEOS, USG, BPSG, FSG, PSG, BSG, or the like, formed by one or more deposition processes (e.g., a PVD process, a CVD process, a PE-CVD process, or the like). The third upper ILD layer 126$U_3$ is selectively patterned to form a plurality of interconnect via openings 2802 and a bit-line opening 2804 that expose an upper surface of local interconnect 116. The plurality of interconnect via openings 2802 and the bit-line opening 2804 are defined by sidewalls of the third upper ILD layer 126$U_3$.

Figure 29:
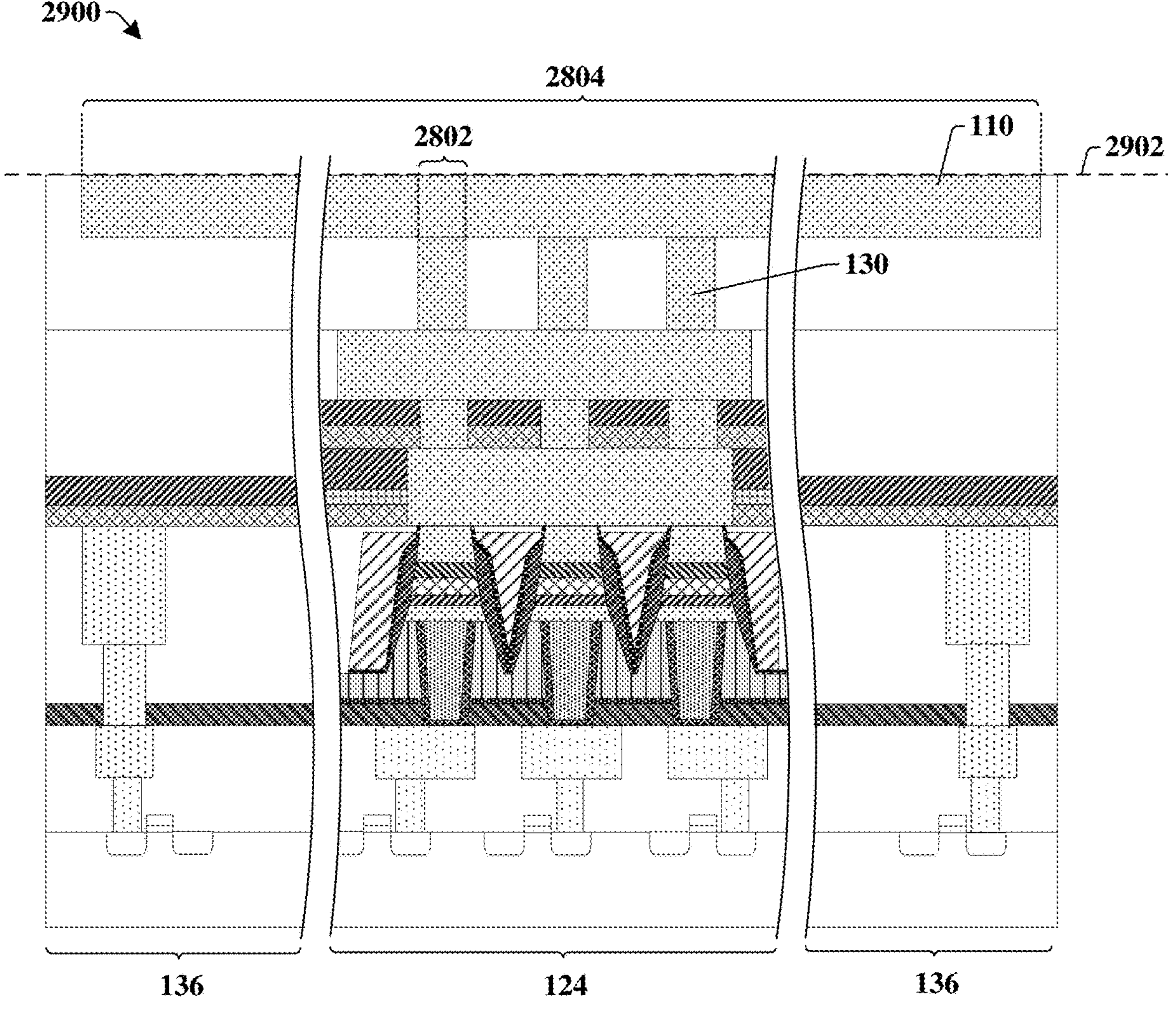

As shown in cross-sectional view 2900 of FIG. 29, a plurality of interconnect vias 130 are formed within the plurality of interconnect via openings 2802 and a bit-line 110 is formed within the bit-line opening 2804. In some embodiments, the plurality of interconnect vias 130 and/or the bit-line 110 may be formed by depositing a conductive material (e.g., tungsten, copper, and/or aluminum) within the plurality of interconnect via openings 2802 and the bit-line opening 2804. A planarization process 2902 (e.g., a CMP process) is subsequently performed to remove excess of the conductive material from over the third upper ILD layer 126$U_3$.

Figure 30:
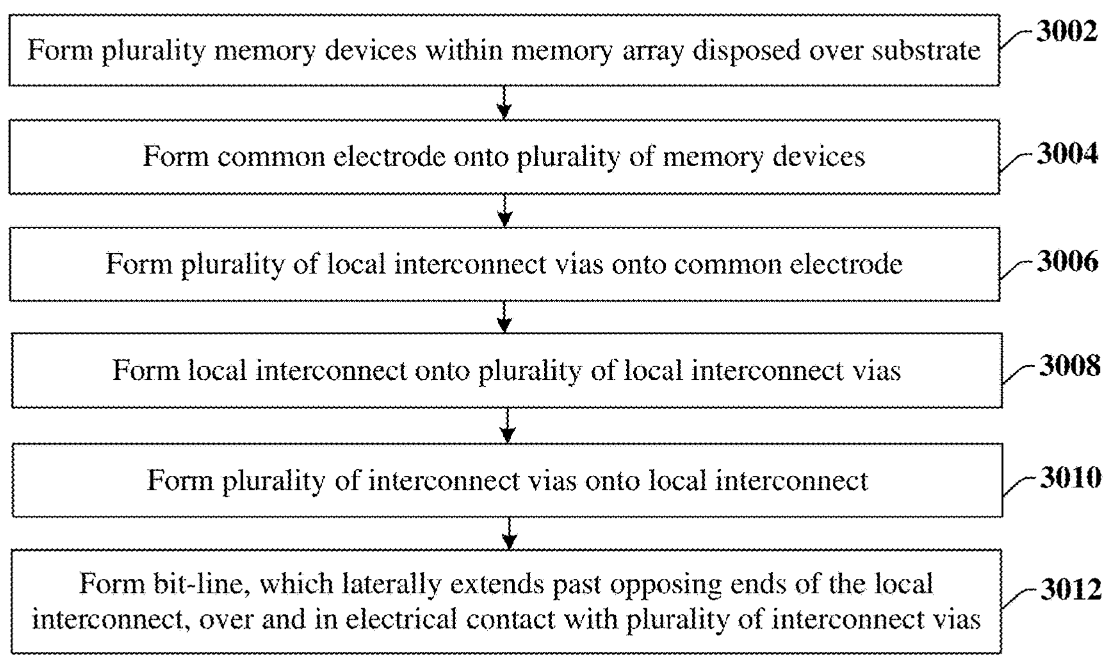
FIG. 30 illustrates a flow diagram of some embodiments of a method of forming an integrated chip structure comprising a memory array having a local interconnect configured to reduce a resistance of a bit-line.

FIG. 30 illustrates a flow diagram of some embodiments of a method 3000 of forming an integrated chip structure comprising a memory array having a local interconnect configured to reduce a resistance of a bit-line.

While method 3000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3002, a plurality memory devices are formed within a memory array disposed over a substrate. FIGS. 13-21 illustrate cross-sectional views 1300-2100 of some embodiments corresponding to act 3002.

At act 3004, a common electrode is formed onto the plurality of memory devices. FIGS. 22-24 illustrate cross-sectional views 2200-2400 of some embodiments corresponding to act 3004.

At act 3006, a plurality of local interconnect vias are formed onto the common electrode. FIGS. 25-27 illustrate cross-sectional views 2500-2700 of some embodiments corresponding to act 3006.

At act 3008, a local interconnect is formed onto the plurality of local interconnect vias. FIGS. 25-27 illustrate cross-sectional views 2500-2700 of some embodiments corresponding to act 3008.

At act 3010, a plurality of interconnect vias are formed onto the local interconnect. FIGS. 28-29 illustrate cross-sectional views 2800-2900 of some embodiments corresponding to act 3010.

At act 3012, a bit-line, which laterally extends past opposing ends of the local interconnect, is formed over and in electrical contact with plurality of interconnect vias. FIGS. 28-29 illustrate cross-sectional views 2800-2900 of some embodiments corresponding to act 3012.

Accordingly, in some embodiments, the present disclosure relates to an integrated chip structure comprising a memory array having a local interconnect that is configured to reduce a resistance of a bit-line within the memory array.

In some embodiments, the present disclosure relates to an integrated chip structure. The integrated chip structure includes a memory array having a plurality of memory devices arranged in a plurality of rows and a plurality of columns; a word-line coupled to a first set of the plurality of memory devices disposed within a first row of the plurality of rows; a bit-line coupled to a second set of the plurality of memory devices disposed within a first column of the plurality of columns; and a local interconnect extending in parallel to the bit-line and coupled to the bit-line and two or more of the second set of the plurality of memory devices, the local interconnect being coupled to the bit-line by a plurality of interconnect vias that are between the local interconnect and the bit-line. In some embodiments, the local interconnect is vertically between the two or more of the second set of the plurality of memory devices and the bit-line. In some embodiments, the local interconnect continuously extends laterally past outermost edges of the two or more of the second set of the plurality of memory devices. In some embodiments, the local interconnect continuously extends laterally past the plurality of interconnect vias. In some embodiments, the bit-line laterally extends past opposing ends of the local interconnect. In some embodiments, the integrated chip structure further includes a bit-line decoder coupled to the bit-line and configured to selectively apply a signal to the bit-line during an access operation. In some embodiments, the integrated chip structure further includes an additional bit-line coupled to a third set of the plurality of memory devices disposed within the first column of the plurality of columns, an end of the bit-line being separated from an end of the additional bit-line by a non-zero distance; and an additional local interconnect extending in parallel to the additional bit-line, the additional local interconnect being coupled between the additional bit-line and two or more of the third set of the plurality of memory devices. In some embodiments, the integrated chip structure further includes a bit-line decoder coupled to the bit-line, the bit-line decoder being configured to selectively apply a signal to the bit-line during an access operation; and an additional bit-line decoder coupled to the additional bit-line, the additional bit-line decoder being configured to selectively apply an additional signal to the additional bit-line during an additional access operation. In some embodiments, the integrated chip structure further includes a common electrode disposed between the local interconnect and the two or more of the second set of the plurality of memory devices, the local interconnect being coupled to the common electrode by way of a plurality of local interconnect vias.

In other embodiments, the present disclosure relates to an integrated chip structure. The integrated chip structure includes a memory array having a plurality of memory devices arranged within a dielectric structure disposed over a substrate as viewed in a cross-sectional view; a bit-line disposed over the plurality of memory devices; a local interconnect extending in parallel to the bit-line and coupled to the plurality of memory devices, the bit-line extending laterally past opposing ends of the local interconnect; and the local interconnect being coupled to the bit-line by a plurality of interconnect vias that are disposed between a top of the local interconnect and a bottom of the bit-line. In some embodiments, the plurality of interconnect vias laterally extend past two or more of the plurality of memory devices. In some embodiments, the integrated chip structure further includes a common electrode disposed between the local interconnect and the plurality of memory devices and continuously extending past outermost edges of the plurality of memory devices, the local interconnect being coupled to the common electrode by way of a plurality of local interconnect vias. In some embodiments, the local interconnect laterally extends past opposing ends of the common electrode. In some embodiments, the integrated chip structure further includes an upper ILD structure laterally surrounding the bit-line; and a peripheral interconnect via vertically extending through the upper ILD structure outside of the memory array, the peripheral interconnect via vertically extending past the common electrode and the plurality of local interconnect vias. In some embodiments, the plurality of memory devices respectively include a magnetic tunnel junction (MTJ) disposed between a bottom electrode and a top electrode. In some embodiments, the integrated chip structure further includes a plurality interconnect islands contacting upper surfaces of the plurality of interconnect vias; and a plurality of additional upper interconnect vias contacting upper surfaces of the plurality of interconnect islands and a lower surface of the bit-line. In some embodiments, the memory array includes one or more additional memory devices disposed laterally outside of the local interconnect, as viewed in the cross-sectional view. In some embodiments, the integrated chip structure further includes a transistor device disposed within a peripheral region of the substrate that surrounds an embedded memory region of the substrate comprising the plurality of memory devices, the bit-line extending to within the peripheral region of the substrate and the local interconnect being confined within the embedded memory region of the substrate.

In yet other embodiments, the present disclosure relates to a method for forming an integrated chip structure. The method includes forming a plurality of memory devices over a substrate; forming a first upper inter-level dielectric (ILD) layer over the plurality of memory devices; patterning a first upper ILD layer to form a local interconnect opening that extends laterally past opposing edges of the plurality of memory devices; forming a local interconnect within the local interconnect opening; forming a plurality of interconnect vias within a second upper ILD layer that is over the first upper ILD layer; and forming a bit-line over the plurality of interconnect vias, the plurality of interconnect vias coupling the local interconnect to the bit-line. In some embodiments, the method further includes forming a first dielectric stack over the plurality of memory devices; patterning the first dielectric stack to form a common electrode opening that exposes tops of the plurality of memory devices; and forming a common electrode within the local interconnect opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
- forming a plurality of memory devices over a substrate;
- forming a first dielectric stack over the plurality of memory devices;
- patterning the first dielectric stack to form a common electrode opening extending laterally past tops of the plurality of memory devices;
- forming a common electrode within the common electrode opening;
- forming a first upper inter-level dielectric (ILD) layer over the common electrode;
- patterning the first upper ILD layer to form a local interconnect opening that extends laterally past opposing edges of the common electrode;
- forming a local interconnect within the local interconnect opening;
- forming a plurality of interconnect vias within a second upper ILD layer that is over the first upper ILD layer; and
- forming a bit-line over the plurality of interconnect vias, wherein the plurality of interconnect vias couple the local interconnect to the bit-line.

2. A method of forming an integrated chip structure, comprising:
- forming a plurality of memory devices over a substrate;

forming a first inter-level dielectric (ILD) layer to laterally surround the plurality of memory devices;

forming a peripheral lower interconnect within the first ILD layer;

forming a first dielectric stack over the plurality of memory devices and the first ILD layer;

forming a common electrode within the first dielectric stack, the common electrode laterally extending over the plurality of memory devices;

forming a second dielectric stack over the first dielectric stack and the common electrode;

forming a plurality of vias within the second dielectric stack and on the common electrode;

forming a second ILD layer over the second dielectric stack and the plurality of vias;

forming a peripheral via extending through a part of the second ILD layer, wherein the peripheral via is laterally outside of the plurality of memory devices and the common electrode, wherein the peripheral via has a bottommost surface that is at an equal height over the substrate as a bottommost surface of the common electrode, and wherein the peripheral lower interconnect contacts the bottommost surface of the peripheral via along an interface that is a non-zero distance vertically below a top of the common electrode, and wherein the peripheral lower interconnect laterally extends past an outermost sidewall of the peripheral via; and forming an interconnect wire within the second ILD layer and on the plurality of vias.

3. The method of claim 2, wherein the first dielectric stack comprises a first plurality of dielectric layers stacked onto one another; and wherein the second dielectric stack comprises a second plurality of dielectric layers stacked onto one another.

4. The method of claim 2, wherein a bottommost surface of the first dielectric stack is above a topmost surface of the plurality of memory devices.

5. The method of claim 2, wherein the second dielectric stack is formed over the first dielectric stack and along opposing outermost sidewalls of the first dielectric stack; and wherein the second ILD layer is formed over the second dielectric stack and along opposing outermost sidewalls of the second dielectric stack.

6. The method of claim 2, further comprising:

forming a third ILD layer over the second ILD layer and the interconnect wire;

forming a plurality of upper vias within the third ILD layer and on the interconnect wire; and forming an upper interconnect wire within the third ILD layer and on the plurality of upper vias.

7. The method of claim 6, wherein the upper interconnect wire laterally extends past opposing ends of the interconnect wire and the interconnect wire laterally extends past opposing ends of the common electrode.

8. The method of claim 2, wherein the first dielectric stack comprises a plurality of different layers of dielectric materials.

9. The method of claim 2, further comprising:

forming sidewall spacers along opposing sides of the plurality of memory devices, wherein the plurality of memory devices comprise a top electrode protruding outward to above a top of the sidewall spacers; and forming a dielectric encapsulation layer along sides of the sidewall spacers, wherein the first ILD layer laterally surrounds the dielectric encapsulation layer and wherein the dielectric encapsulation layer has a topmost surface laterally extending between neighboring ones of the plurality of memory devices.

10. The method of claim 9, wherein opposing outermost sidewalls of the common electrode are separated by a first distance and opposing outermost sidewalls of the dielectric encapsulation layer are separated by a second distance that is larger than the first distance.

11. The method of claim 2, further comprising:

forming a dielectric encapsulation layer along sides of the plurality of memory devices, wherein the bottommost surface of the common electrode is a second non-zero distance vertically above a topmost surface of the dielectric encapsulation layer that laterally extends between neighboring ones of the plurality of memory devices.

12. The method of claim 2, wherein the first ILD layer comprises a topmost surface that laterally extends past the plurality of memory devices in opposing directions in a cross-sectional view, an entirety of the topmost surface being a second non-zero distance vertically above a topmost surface of the plurality of memory devices.

13. A method of forming an integrated chip structure, comprising:

forming a plurality of memory devices over a substrate as viewed in a cross-sectional view;

forming a common electrode over the plurality of memory devices and continuously extending past outermost edges of the plurality of memory devices;

forming a local interconnect over the plurality of memory devices, wherein the common electrode is vertically between the local interconnect and the plurality of memory devices and is coupled to the local interconnect by way of a plurality of local interconnect vias;

forming a plurality of interconnect vias over the local interconnect;

forming a bit-line over the local interconnect, the bit-line extending in parallel to the local interconnect and past opposing ends of the local interconnect; and wherein the local interconnect is coupled to the bit-line by the plurality of interconnect vias, the plurality of interconnect vias being disposed between a top of the local interconnect and a bottom of the bit-line.

14. The method of claim 13, wherein the plurality of interconnect vias are arranged within an array that laterally extends past two or more of the plurality of memory devices.

15. The method of claim 13, wherein the local interconnect laterally extends past opposing ends of the common electrode.

16. The method of claim 13, wherein the local interconnect has a greater width than the common electrode and the bit-line has a greater width than the local interconnect.

17. The method of claim 13, wherein the plurality of memory devices respectively comprise a magnetic tunnel junction (MTJ) disposed between a bottom electrode and a top electrode.

18. The method of claim 13, further comprising:

forming a plurality of interconnect islands onto upper surfaces of the plurality of interconnect vias;

forming a plurality of additional upper interconnect vias contacting upper surfaces of the plurality of interconnect islands; and forming the bit-line onto upper surfaces of the plurality of additional upper interconnect vias.

19. The method of claim 13, wherein one or more additional memory devices are disposed laterally outside of the local interconnect, as viewed in the cross-sectional view.

20. The method of claim 13, further comprising:

forming a transistor device within a peripheral region of the substrate that surrounds an embedded memory region of the substrate comprising the plurality of memory devices, wherein the bit-line extends to within the peripheral region of the substrate and the local interconnect is confined within the embedded memory region of the substrate.

* * * * *